United States Patent [19]
Duncan, Jr.

[11] Patent Number: 6,026,418
[45] Date of Patent: Feb. 15, 2000

[54] FREQUENCY MEASUREMENT METHOD AND ASSOCIATED APPARATUS

[75] Inventor: Paul Harvey Duncan, Jr., Santa Ana, Calif.

[73] Assignee: McDonnell Douglas Corporation, St. Louis, Mo.

[21] Appl. No.: 08/957,915

[22] Filed: Oct. 27, 1997

Related U.S. Application Data

[60] Provisional application No. 60/029,273, Oct. 28, 1996.

[51] Int. Cl.$^7$ ........................................................ G06F 17/10
[52] U.S. Cl. .................. 708/309; 324/76.21; 324/76.47; 702/77
[58] Field of Search ............................ 708/309; 702/75, 702/76, 77; 324/76.21, 76.47

[56] References Cited

U.S. PATENT DOCUMENTS

| | | | |
|---|---|---|---|
| 4,904,930 | 2/1990 | Nicholas | 324/76.21 |
| 5,099,194 | 3/1992 | Sanderson et al. | 324/76.47 |
| 5,099,243 | 3/1992 | Tsui et al. | 324/76.47 |
| 5,109,188 | 4/1992 | Sanderson et al. | 324/76.47 |
| 5,198,748 | 3/1993 | Tsui et al. | 324/76.21 |
| 5,235,287 | 8/1993 | Sanderson et al. | 324/76.47 |
| 5,293,114 | 3/1994 | McCormick et al. | 324/76.22 |
| 5,323,103 | 6/1994 | Choate et al. | 324/76.21 |
| 5,471,396 | 11/1995 | White | 702/66 |
| 5,497,400 | 3/1996 | Carson et al. | 375/324 |

OTHER PUBLICATIONS

A.V. Balakrishnan, On The Problem Of Time Jitter In Sampling, *IRE Transactions On Information Theory*, Apr. 1962, pp. 226–236.

Stuart K. Tewksbury, Frederick C. Meyer, David C. Rollenhagen, H.K. Schoenwetter, Thomas M. Souders, Terminology Related To The Performance Of S/H, A/D, and D/A Circuits, *IEEE Transactions On Circuits And Systems*, vol. CAS–25, No. 7, Jul. 1978, pp. 419–426.

Albert H. Nuttall, Weighted Least Squares Fit Of A Real Tone To Discrete Data, By Means Of An Efficient Fast Fourier Transform Search, *NUSC Technical Report* 7785, Aug. 27, 1986.

J. Schoukens, R. Pintelon, H. Van hamme, The Interpolated Fast Fourier Transform: A Comparative Study, *IEEE*, 1991, pp. 358–364.

Yuichi Noro, Kenji Inomoto, Kazuhiro Kuno, Sinusoidal Frequency Estimation With Small–Sized DFT, *Electronics And Communications In Japan*, Part. 3, vol. 74, No. 1, 1991, pp. 22–30.

R.H. Walden, Analog–To–Digital Converter Technology Comparison, *IEEE*, 1994, pp. 217–219.

*Primary Examiner*—David H. Malzahn
*Attorney, Agent, or Firm*—Alston & Bird LLP

[57] ABSTRACT

The frequency measurement method and associated apparatus accurately determines the frequency of a periodic signal even if the frequency exceeds the nyquist frequency, typically established by the analog to digital ("A/D") converter used to sample the signal. The frequency measurement method and apparatus obtains samples of a periodic signal at a number of sample rates, converts the samples to the frequency domain, analyzes the first order alias frequencies produced due to undersampling of the signal, and determines the frequency of the periodic signal based upon the alias frequencies. In selecting the sampling rate and the first order alias frequencies, the frequency measurement method and apparatus accounts for sampling errors, frequency calculation errors, desired frequency ranges, and measurement precision. Through error compensation and minimization techniques, the frequency measurement method and apparatus reduces the number of electrical components required (e.g. A/D converters). Further, the error compensation and minimization techniques utilized by the frequency measurement method and apparatus allows the use of shorter transforms for converting the time-domain data to the frequency domain, which thereby increases calculation speed while estimating the frequency of the periodic signals with greater accuracy.

23 Claims, 11 Drawing Sheets

FREQUENCY MEASUREMENT METHOD AND ASSOCIATED APPARATUS

RELATED APPLICATIONS

This application claims priority from U.S. Provisional Patent Application Ser. No. 60/029,273 entitled "Digital Frequency Measurement" which was filed on Oct. 28, 1996, the contents of which are incorporated in their entirety herein.

FIELD OF THE INVENTION

The present invention relates to a method and apparatus for estimating the frequency of a periodic signal and, more particularly, to a method and apparatus for estimating the frequency of a periodic signal wherein the frequency exceeds the nyquist frequency established by a sampling rate used to sample the signal.

BACKGROUND OF THE INVENTION

Methods for determining the frequency of periodic signals have many useful applications in a wide range of technologies. As an example, periodic signal frequency analysis is useful in applications where a system produces electrical or mechanical vibration signals. By analyzing these signals and determining the frequencies present in the signal, useful information can be gleaned about the operation of the system. For instance, in applications where electrical motor speed and control are of interest, frequency determination methods are very useful. By analyzing the frequency of the voltage produced by an electric motor, one can determine the speed at which the motor is operating. Knowing this speed, the control system can adjust the electric power supplied to the motor to regulate its speed.

Frequency analysis is also used to determine component failure in machinery. In this application, either electrical signals or mechanical vibrations generated by a machine are measured and compared to the frequencies at which known internal machine parts (i.e. gears) operate is analyzed to determine if these parts are operating at normal operating speeds. Any deviation in this speed will indicate possible fault in that particular part.

Frequency determination is also very important in the field of communications. For example, frequency determinations can be utilized to demodulate a frequency modulated signal. Further, periodic signal determinations are useful where a system is transmitting data at a carrier of unknown frequency. By analyzing the signals produced by the system, one can pinpoint the carrier frequency. The above are just a few examples of the need for accurate and efficient periodic signal analysis.

The determination of the frequency of a periodic signal can be performed by many different methods including both analog and digital methods. For example, one digital method for determining the frequency of a periodic signal involves using a counter which measures the time interval between zero crossings of the periodic signal. By taking the inverse of this time interval, the frequency of the periodic signal is determined. For example, if the time interval between zero crossings is ten seconds, then the frequency of the periodic signal is 0.1 Hz.

Another digital method for the determination of the frequency of a given periodic signal is the zero counting method. This method involves counting the number of times a periodic signal crosses zero during a given time frame. For example, if the signal crosses zero five times during a one second interval the signal has a frequency of 5 Hz.

The frequency of a periodic signal can also be determined from digital analysis of the periodic signal. For example, a periodic signal can be sampled by an analog to digital ("A/D") converter. This A/D converter transforms the analog signal into a set of time-domain digital data points. These digital data points are converted to frequency-domain data points by the use of fourier transforms. As described below, these frequency-domain data points can then be analyzed by frequency determination methods which calculate the frequency of the periodic signal by analyzing the data points.

Digital analysis methods are generally advantageous to analog methods. Analog methods typically require several devices for analyzing the signal, are less accurate, and more susceptible to noise. Digital methods, on the other hand, alleviate these problems by incorporating a digital computer which operates under the control of computer software analyze the digital signal. The use of digital computers and computer software, not only reduces the number of devices needed, it also decreases calculation time and allows for data storage of the signal. Further, digital methods can utilize methods to counteract signal noise and improve accuracy, thereby making digital signal analysis methods more accurate, less susceptible to noise, and flexible. However, digital signal analysis methods do have several limitations. One limitation, in particular, is the limitation on the maximum frequency of a periodic signal that can be properly sampled and determined.

Typically, in digital frequency analysis, an A/D converter obtains digital samples of an analog signal. The A/D typically acquires data samples of the analog signal over a fixed data sampling period. The number of data samples the A/D converter obtains per unit time is known as the sampling rate of the A/D converter. In this manner, the A/D converter produces a discrete number of data points which correspond to the analog signal. These data points are then analyzed with frequency determination methods to calculate the frequency of the periodic signal.

Difficulties occur, however, when the frequency of the analog signal is larger than half the sampling rate of the A/D converter. Half the sampling rate of an A/D converter is called the A/D converter's nyquist frequency. When periodic signals with frequencies exceeding this nyquist frequency are sampled by the A/D converter, the periodic signal is undersampled, and thus the high frequency information of the periodic signal is not uniquely defined, thereby making accurate high signal frequency analysis via conventional signal processing methods impossible.

When periodic signals contain frequencies which exceed the nyquist frequency of the A/D converter, a phenomenon known as aliasing occurs. In this event, frequency signals, known as alias signals, are introduced into the data sampled by the A/D converter. Since the relationship of these alias frequencies to the signal frequency is not uniquely defined, frequency determination by conventional methods is impossible.

Methods have been developed to determine the frequency of periodic signals with frequencies exceeding the nyquist frequency of an A/D converter. These methods utilize the aliasing frequencies that are generated when a periodic signal is undersampled. Knowledge of these aliased signals allows for determination of the frequency of a periodic signal that exceeds the nyquist frequency.

U.S. Pat. No. 5,099,243 to Tsui et al. and U.S. Pat. No. 5,099,194 to Sanderson et al. describe digital methods which use the alias frequencies generated from undersampling of a periodic signal to determine its frequency. Both of these methods determine the frequency of a signal through graphic calculations using the first order aliasing frequencies of two sampled sets of the signal taken at two different sample rates, $f_0$ and $f_1$.

Although the methods described by the Tsui et al. and Sanderson et al. determine the frequency of a signal that exceeds the nyquist frequency of an A/D converter, these methods have some drawbacks. First, these two methods require multiple A/D converters for frequency determination. Further, the frequency of the periodic signal can be directly determined only when the two chosen sampling rates, $f_0$ and $f_1$, combine in the equation $n=f_0/(f_1-f_0)$ such that n is an integer. If this criterion is not met, the frequency can be determined only from the use of look up tables.

Further, both patents disclose that ambiguous solutions are found when two sample rates are used. Sanderson et al. indicates that such ambiguities can be remedied by the use of a third sampling rate. However, this third sampling rate must also satisfy $n=f_0/(f_1-f_0)$ such that n is an integer. Further, the Sanderson et al. system requires yet another A/D converter to obtain data at this third sampling rate. Also, both of these methods require calculation of the frequency through graphical methods which are not convenient, practical, or amendable to software implementation.

Finally, neither Tsui et al. nor Sanderson et al. disclose error correction for frequency measurement. Errors such as signal noise and electronic component noise can not only negate the effectiveness of the frequency determination but, in some instances, can produce totally erroneous results. For example, errors due to signal noise are extremely troublesome in frequencies near zero or the nyquist frequency. If the alias frequencies chosen by Sanderson et al. and Tsui et al. to calculate the signal frequency are near zero or the nyquist frequency, these errors will significantly affect the results of the calculation.

Further, and importantly, calculation errors are introduced during the transformation of data samples from time-domain to frequency-domain. In order to increase the accuracy of this transformation, the Tsui et al. and Sanderson et al. methods generally use longer transforms. Unfortunately, these longer transforms increase computing time for frequency determination.

For the foregoing and other reasons, there exists a need for a frequency measurement method for determining the frequency of periodic signals that exceed the nyquist frequency of an A/D converter which reduces the amount of electrical components needed, reduces measurement and calculation errors, and reduces computing and sampling time.

SUMMARY OF THE INVENTION

As set forth below, the frequency measurement method and associated apparatus of the present invention overcomes the deficiencies identified with the conventional methods. In particular, the frequency measurement method and associated apparatus of the present invention accurately determines the frequency of a periodic signal even if the frequency exceeds the nyquist frequency, typically defined by sampling rate of the analog to digital ("A/D") converter used to sample the signal. The frequency measurement method and apparatus obtains samples of a periodic signal at a plurality of sample rates, converts the samples to the frequency domain, analyzes the first order alias signals produced due to undersampling of the signal, and determines the frequency of the periodic signal based upon the alias frequencies. In selecting the sampling rate and the first order alias frequencies, the method and apparatus of the present invention accounts for sampling errors, frequency calculation errors, desired frequency ranges, and measurement precision. Through error compensation and minimiztion methods, the method and apparatus of the present invention reduces the number of electrical components required (e.g. A/D converters). Further, the error compensation and minimization methods utilized by the method and apparatus of the present invention allows the use of shorter transforms for converting the time-domain data to the frequency domain, which thereby increases calculation speed while providing more accurate estimates of the frequency of the periodic signals.

These and other advantages are provided, according to the present invention, by a method and associated apparatus for estimating the frequency of a periodic signal. The frequency measurement method and apparatus samples a periodic signal at a plurality of sampling rates, typically by means of an A/D converter, to obtain a plurality of time-domain sample sets representing the periodic signal. These time-domain sample sets are converted into respective frequency-domain sample sets, usually by means of signal processing. The frequency-domain sample sets are then analyzed, such as by the first determining means, to determine an alias frequency for each of the plurality of frequency-domain sample sets. The frequency measurement method and apparatus thereafter selects a subset of the plurality of alias frequencies, typically by means of a selection means. This selection process accounts for possible errors and selects the subset so as to reduce errors in the calculation of the frequency of the periodic signal. Finally, the frequency measurement method and apparatus, such as a second determining means, determines the frequency of the periodic signal based upon the selected subset of alias frequencies. In this embodiment, the frequency measurement method and apparatus of the present invention determines the frequency of a periodic signal, even though the frequency of the periodic signal exceeds the largest nyquist frequency established by the plurality of sampling rates.

The frequency measurement method of one embodiment of the present invention includes the step of selecting a plurality of sampling rates for determining the frequency of the periodic signal. Preferably, the rates at which the periodic signal will be sampled are selected such that frequency determination errors are minimized. As such, these sampling rates are advantageously selected based at least partially on sampling errors, frequency calculation errors, desired frequency ranges, and measurement precision.

In a further embodiment of the present invention, a method for selecting the plurality of sampling rates $f_i$ in order to reduce errors in the resulting frequency determination is disclosed. The method of this embodiment involves the step of selecting a first sampling rate $f_{smax}$ which will be the maximum rate at which the periodic signal will be sampled. This maximum sample rate is typically the maximum sampling rate of the A/D converter of the frequency measurement apparatus. Next, a determination of the maximum estimatable frequency is made. The value of the maximum estimatable frequency is influenced by factors such as maximum sampling rate, range of frequencies to be measured, and system errors. With knowledge of the maximum sampling rate and the maximum estimatable frequency, a frequency sample separation increment $\Delta f$ can be ascertained. This frequency sample separation increment represents the frequency interval between the individual frequencies of the plurality of sampling rates. Finally, the frequency measurement method of this embodiment determines the plurality of sampling rates based upon the following equation:

$$f_i = f_{smax} - (i * \Delta f)$$

where $f_{smax}$=first sampling rate, and i=(1, 2, 3, . . . ).

This method is iteratively performed by evaluating the performance obtained with differing transform lengths until a plurality of sampling rates is determined that can accurately measure the desired frequency.

In some applications, it is advantageous to determine estimation errors associated with the determination of the frequency of the periodic signal. Thus, one embodiment of the frequency measurement method and apparatus determines a frequency estimation error that is at least partially based upon noise errors associated with the periodic signal, sampling errors, and calculation errors.

This frequency estimation error is particularly important in one further embodiment of the present invention. In this embodiment, estimation errors are unacceptable in the frequency ranges closest to zero and to the nyquist frequency established by the sampling rate. Thus, the frequency measurement method and apparatus selects a subset of alias frequencies from the plurality of alias frequencies by selecting alias frequencies which are not within a frequency estimation error of either zero or a respective nyquist frequency, thereby selecting alias frequencies which will reduce error in the determination of the frequency of the periodic signal.

In some applications, it is advantageous to reduce errors associated with converting the time-domain sample sets to frequency-domain sample sets. To reduce error, one embodiment of the frequency measurement method and apparatus determines which one of many conversion routines should be used with recognition that conversion routines with longer transforms have reduced conversion errors, but require increased processing time. The conversion routine is determined by first selecting desired low and high frequency limits, and a desired frequency estimation error limit. Further, a maximum estimatable frequency and an achievable frequency estimation error are determined. Finally, the desired high frequency limit and the desired frequency estimation error limit are compared to the maximum estimatable frequency and achievable frequency estimation error, respectively. Based on the results of this comparison an appropriate conversion routine is determined for converting each of the time-domain sample sets into respective frequency-domain sample sets.

One advantageous embodiment of the frequency measurement method and apparatus estimates the frequency of a periodic signal using three sampling rates. The frequency measurement method and apparatus samples the periodic signal at a first, second, and third sampling rate to obtain a first, second, and third time-domain sample set of the periodic signal. These time-domain sample sets are then converted to respective first, second, and third frequency-domain sample sets. A respective alias frequency is then determined for each of the first, second, and third frequency-domain sample sets. From these three alias frequencies, a subset is selected for determining the frequency of the periodic signal.

Preferably, the frequency measurement method and apparatus of this embodiment selects the two of the three alias frequencies containing the least error. In this regard, the frequency measurement method and apparatus individually evaluates the alias frequencies to determine if they are close to either zero or the nyquist frequency established by their respective sampling rate. Since the alias frequencies closest to zero or the nyquist frequency typically contain the largest errors, the two alias frequencies which are not within a frequency estimation error of zero or the nyquist frequency are preferably selected. For example, the second and third alias frequencies will be selected if the first alias frequency is within a predetermined frequency estimation error of either zero or the nyquist frequency established by the first sampling rate. Alternatively, the first and third alias frequencies are preferably selected if the second alias frequency is within a predetermined frequency estimation error of either zero or the nyquist frequency established by the second sampling rate. Finally, the first and second alias frequencies are preferably selected if the third alias frequency is within a predetermined frequency estimation error of either zero or the nyquist frequency established by the third sampling rate. In any event, the frequency measurement method and apparatus preferably selects the two alias frequencies with the least error for determination of the frequency of the periodic signal.

In some embodiments, it is advantageous to decrease the time required for sampling the periodic signal. This time conservation is achieved by simultaneously sampling the periodic signal at a plurality of sample rates. Thus, the frequency measurement method and apparatus of this embodiment can include a plurality of A/D convertors for sampling at a plurality of sampling rates simultaneously in order to obtain a plurality of time-domain sample sets of the periodic signal. The individual A/D converters sample at a respective one of the plurality of sampling rates such that each A/D converter is sampling at a different sampling rate.

In order to minimize the number of A/D converters while still permitting simultaneously sampling, the frequency measurement apparatus of one embodiment includes a plurality of sample and hold circuits, upstream of the A/D converter, for simultaneously capturing a sample of the periodic signal. The frequency measurement apparatus of this embodiment further includes multiplexing means positioned to receive the plurality of time-domain sample sets and to provide said plurality of time-domain sample sets to the A/D converter. The frequency measurement apparatus of this embodiment further includes a demultiplexing means positioned to receive the time-domain sample sets from the A/D converter such that the plurality of time-domain sample sets can be converted to respective plurality of frequency-domain sample sets. The frequency-domain sample sets are then used to determine the frequency of the signal.

Accordingly, the frequency measurement method and associated apparatus of the present invention determines the frequency of a periodic signal, even though the frequency of the periodic signal exceeds the nyquist frequency established by the converter sampling rate. The method and apparatus of the present invention accounts for errors due to sampling, conversions, and calculations in determining the frequency of the periodic signal. By determining the frequency with greater accuracy, conversion time is reduced because less accurate and, therefore, shorter conversion algorithms are required.

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1A:
FIGS. 1A–1C are a graphic representation of an analog method for determining the frequency of a periodic signal where the frequency exceeds the nyquist frequency of the sampling rate.
Figure 1B:
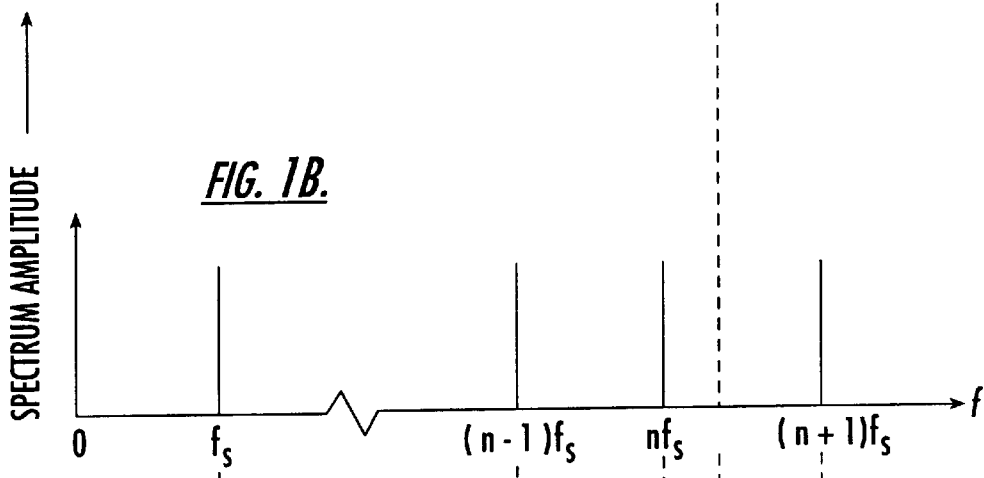
Figure 1C:
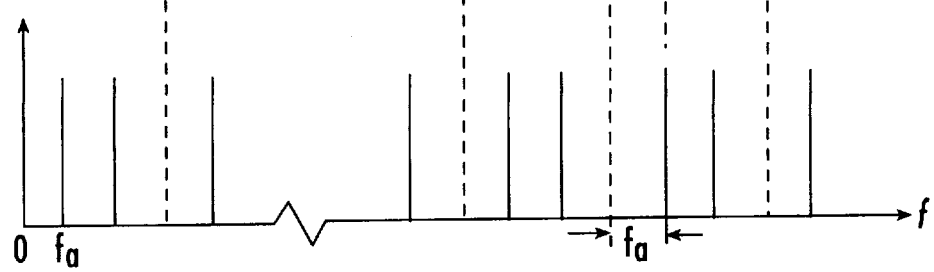

The frequency measurement method and apparatus of the present invention determines the frequency of a periodic signal, even in instances in which the frequency exceeds the nyquist frequency established by the sampling rate at which the periodic signal is sampled. The frequency measurement method and apparatus of this invention are based on the principle shown in FIGS. 1A–1C. FIG. 1A illustrates the frequency spectrum of a periodic signal of interest where f is the frequency of the signal. FIG. 1B illustrates the sampling rate $f_s$ and its successive harmonics having frequencies signified by $(n-1)f_s$, $nf_s$, $(n+1)f_s$, etc. When a periodic signal is sampled with an analog to digital ("A/D") converter where the frequency of the sampled signal exceeds the nyquist frequency of the A/D converter, undersampling of the periodic signal results. Undersampling of a periodic signal introduces frequencies into the data sample known as alias frequencies. FIG. 1C illustrates these alias frequencies which are signified as $f_a$. The relationship of these alias frequencies to the signal frequency is ambiguous, thereby rendering frequency determinations of the periodic signal unattainable with conventional methods.

However, as shown in FIG. 1, the frequency of the periodic signal can be determined by knowledge of the alias frequency, the frequency of the sample rate harmonic nearest the alias frequency ($nf_s$), and whether the sample rate harmonic is larger or smaller than the frequency of the periodic signal. From these parameters, the frequency of the periodic signal can be determined by:

$$f = nf_s + f_a; \text{ where } nf_s < f$$

or $$f = nf_s - f_a; \text{ where } nf_s > f$$

An analog method could be created to implement the above principle, however, analog methods are slow, prone to error, susceptible to noise, require special equipment, and are not flexible. The method and apparatus of the present invention are based on the above principle, however, this current method and apparatus apply the above principle to digital methods and utilize techniques for error reduction, and enhanced efficiency.

Figure 2:
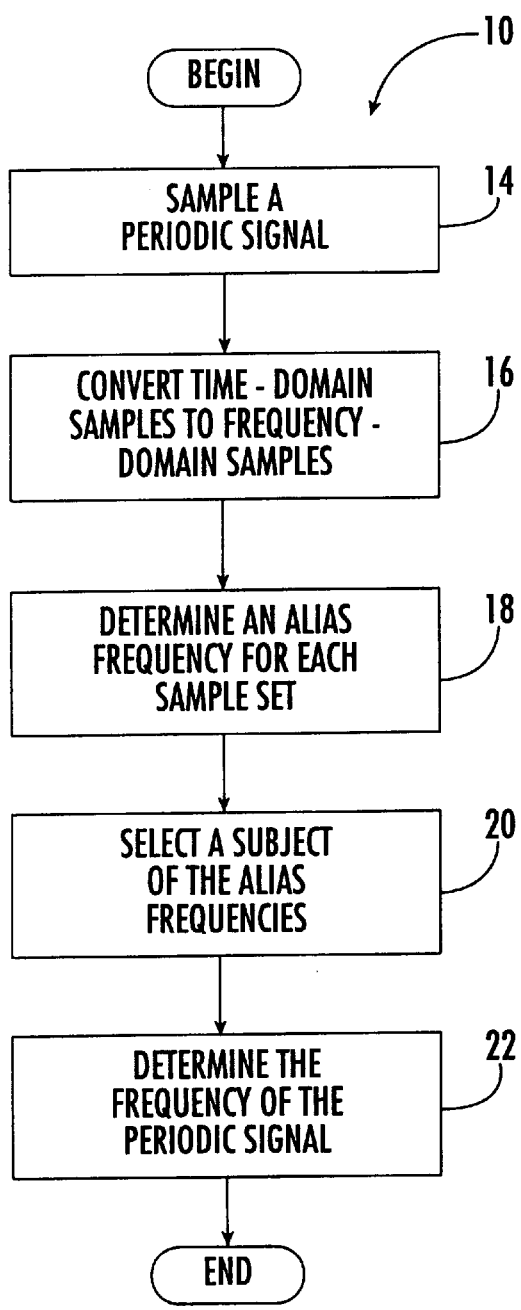
FIG. 2 is a block diagram of a method for determining the frequency of a periodic signal from a plurality of sample rates.
Figure 3:
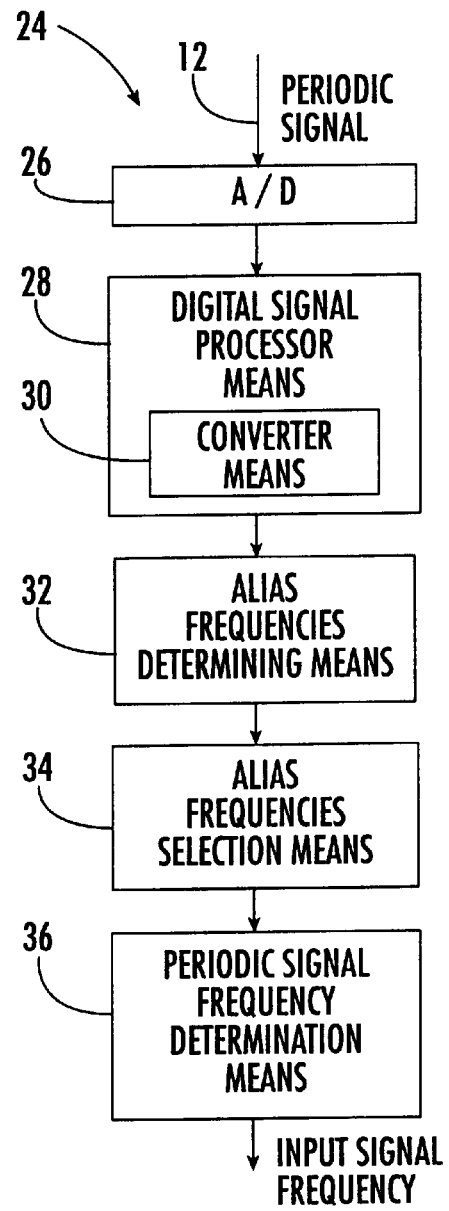
FIG. 3 is a block diagram of an apparatus for determining the frequency of a periodic signal from a plurality of sample rates.

As shown in FIGS. 2 and 3, the frequency measurement method 10 of the present invention accurately estimates the frequency of a periodic signal 12. As illustrated in block 14 of FIG. 2, the frequency measurement method 10 samples a periodic signal at a plurality of sampling rates to obtain a plurality of time-domain sample sets of the periodic signal 12. The frequency measurement method 10 then converts each of the plurality of time-domain sample sets into respective frequency-domain sample sets as shown in block 16. The alias frequency associated with each of the respective frequency-domain sample sets is then determined as shown in block 18. From this plurality of alias frequencies, the frequency measurement method 10 selects a subset of the plurality of alias frequencies as shown in block 20. As described below, the subset of the plurality of alias frequencies is selected so as to reduce errors in the subsequent determination of the frequency of the periodic signal. Based on this subset of alias frequencies, the frequency measurement method 10 determines the frequency of the periodic signal 12 as shown in block 22, even though the frequency of the periodic signal exceeds the largest nyquist frequency established by the plurality of sampling rates.

It is understood that the above method could be implemented by a number of different assemblies. For illustrative purposes, however, FIG. 3 shows one embodiment of a frequency measurement apparatus 24 for estimating the frequency of a periodic signal 12. The apparatus 24 comprises an analog to digital converter 26 for sampling a periodic signal at a plurality of sampling rates to obtain a plurality of time-domain sample sets of a periodic signal 12. The frequency measurement apparatus further comprises digital signal processor means 28 positioned to receive the plurality of time-domain sample sets from the analog to digital converter 26. The digital signal processor means 28 comprises converter means 30 which converts the plurality of time-domain sample sets to a respective plurality of frequency-domain sample sets. These frequency-domain sample sets are received by the first determining means 32 of the frequency measurement apparatus which determines, for each of the plurality of frequency-domain sample sets, an alias frequency associated with the respective frequency-domain sample set. The frequency measurement apparatus further comprises selecting means 34 for selecting a subset of the plurality of alias frequencies. This selecting means 34 selects the subset of alias frequencies so as to reduce errors in the determination of the frequency of the periodic signal 12. The subset of alias frequencies is utilized by the second determining means 36 of the frequency measurement apparatus which determines the frequency of the periodic signal based upon the selected subset of alias frequencies. As such, the apparatus 24 determines the frequency of the periodic signal even though it may exceed the largest nyquist frequency established by the plurality of sampling rates.

Although the above embodiment illustrates the use of an analog to digital converter, it must be understood that the periodic signal may be sampled by any suitable sampling means. Further, it must be understood that the digital signal processor means could be embodied by any of a variety of devices which convert time-domain data to frequency-domain data. For example, the digital signal processor means can include a computer that operates under software control so as to receive time-domain sample sets which are then converted into frequency-domain sample sets. Alternatively, the digital signal processor means could be an electronic device, such as a fast fourier transform processor. In addition, the first determining means, the selecting means and the second determining means are typically embodied by a computer that operates under software control. However, the first determining means, the selecting means and the second determining means can be comprised of other combinations of hardware and software without departing from the spirit and scope of the present invention.

Figure 4:
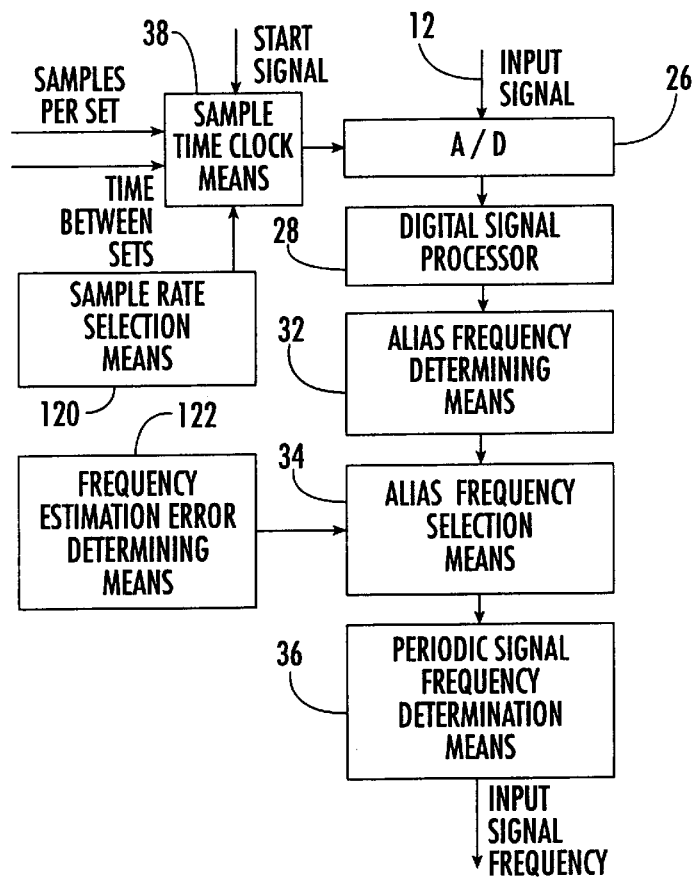
FIG. 4 is one advantageous embodiment of the apparatus in FIG. 3.

In some applications of the present invention, a greater emphasis may be placed on reducing the number of electronic devices or components than on reducing the time required to collect data samples. Thus, as shown in FIG. 4, the frequency measurement apparatus of one embodiment of the present invention includes a single analog to digital converter 26. As shown, the analog to digital converter 26 can include or otherwise be responsive to clock means 38, such as a clock, which triggers the analog to digital converter to sequentially obtain the plurality of time-domain sample sets of the periodic signal based, in turn, upon a number of inputs, such as the samples per set, the time between sets and the selected sample rates as described hereinbelow. In this embodiment, the time for sampling the periodic signal is generally increased because the analog to digital converter must take each sample set sequentially. However, the frequency measurement apparatus only requires one analog to digital converter, thereby reducing the number of electronic devices required. Further, as discussed below, the frequency measurement method and apparatus utilizes error correction which increases the speed of converting the time-domain sample sets to frequency-domain sets. Thus, the extra time required to sequentially sample the signal may be negated by the decreased conversion time.

Figure 5:
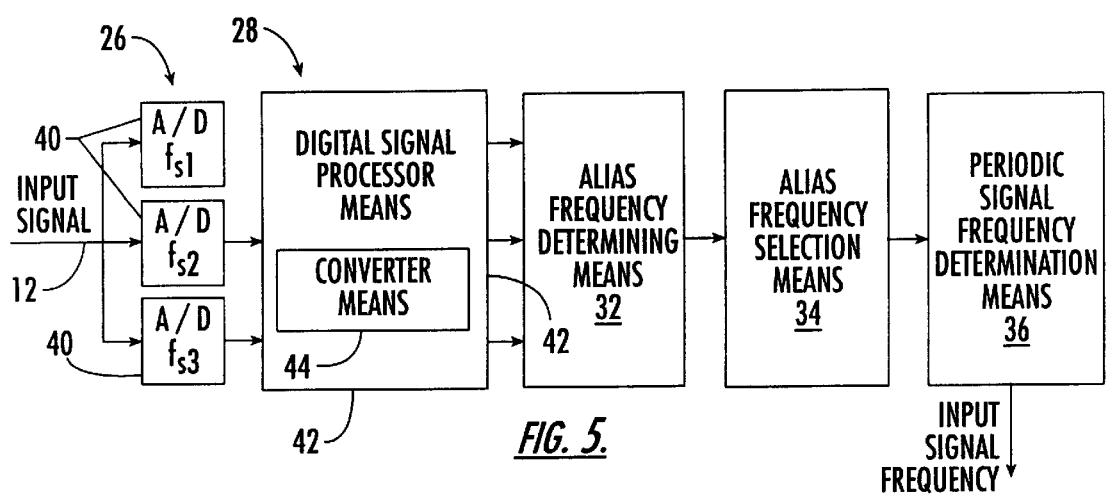
FIGS. 5 is one advantageous embodiment of the apparatus in FIG. 3.

In another embodiment of the present invention shown in FIG. 5, a greater emphasis is placed upon reducing the time required to sample the plurality of time-domain sample sets than on reducing the number of electrical components. In this embodiment, the analog to digital converter 26 comprises a plurality of analog to digital convertors 40 for simultaneously sampling at a plurality of respective sampling rates to obtain a plurality of time-domain sample sets of the periodic signal 12. In this embodiment, each analog to digital converter samples at a respective one of the plurality of sampling rates such that each analog to digital converter is sampling at a different sampling rate. As shown in FIG. 4, the digital signal processor means 28 of this embodiment can include a plurality of digital signal processors 42 positioned to receive respective ones of the plurality of time-domain sample sets from the plurality of analog to digital converters 40. Each of the plurality of digital signal processors 42 includes converter means 44, such as a fast fourier transform processor, for converting the plurality of time-domain sample sets to a respective plurality of frequency-domain sample sets. These sample sets are then input to the first determining means for determining the alias frequency of each of the plurality of sample sets.

Figure 6:
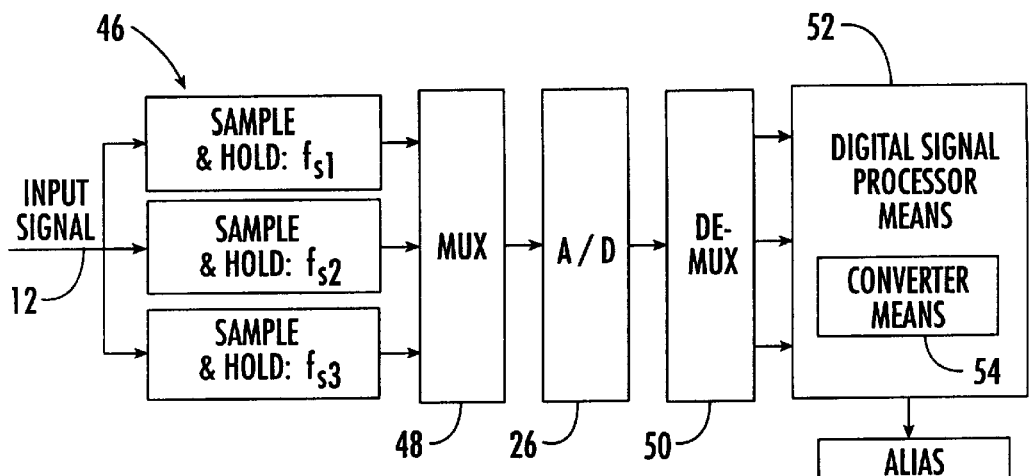
FIG. 6 is one advantageous embodiment of the apparatus in FIG. 3.

In a further embodiment for simultaneously sampling the periodic signal at a plurality of sample rates, the frequency measurement apparatus comprises a plurality of sample and hold circuits 46, see FIG. 6. These sample and hold circuits 46 simultaneously sample the periodic signal 12 and retain a data sample, thereby capturing a "snapshot" of the same portion of the periodic signal. The frequency measurement apparatus of this embodiment further comprises multiplexing means 48, such as a multiplexor, positioned to receive the plurality of data samples and to provide these data samples to the analog to digital converter 26, one sample at a time. The frequency measurement apparatus also includes demultiplexing means 50, such as a demultiplexor, that is positioned to receive the time-domain sample sets from the analog to digital converter 26 and to input these samples sets to a plurality of digital signal processor means 52. The plurality of digital signal processor means 52 each include converter means 54 for converting the plurality of time-domain sample sets to a respective plurality of frequency-domain sample sets. As described below, these frequency-domain sample sets are used by the frequency measurement apparatus to determine the frequency of the periodic signal.

Although FIGS. 3–6 illustrate three embodiments for implementing the frequency measurement apparatus of the current invention, it must be understood that these embodiments are for demonstration purposes only and are not intended in any way to limit the scope of the present invention. Further, the embodiments illustrate the use of analog to digital converters, sample and hold circuits, and digital signal processors. It must be understood, however, that the frequency measurement method and apparatus can be implemented with any device or software program which can be adapted to sample an analog signal and to convert the signal to the frequency-domain.

As stated earlier, the frequency measurement method and apparatus sample a periodic signal at a plurality of sample rates to obtain a plurality of time-domain sample sets. These sample sets are then utilized to determine the frequency of the periodic signal. The frequency measurement method and apparatus of the present invention utilizes a number of algorithms which determine the frequency of a periodic signal, while compensating for errors. To aid in understanding the algorithms of the current invention, one advantageous embodiment of the present invention illustrates the method of determining the frequency of a periodic signal by sampling the signal at three different sample rates.

Figure 7:
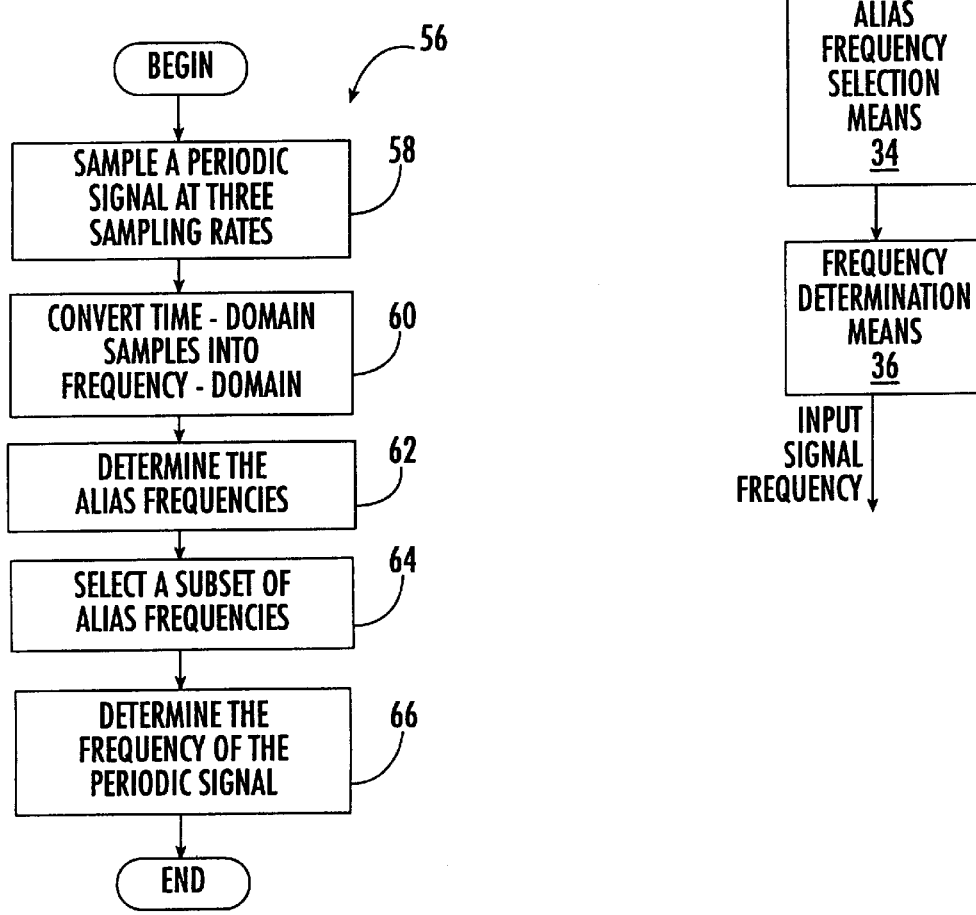
FIG. 7 is a block diagram of one embodiment of the method of FIG. 2, wherein the embodiment determines the frequency of a periodic signal based on sampling the signal at three sampling rates.

This embodiment of the frequency measurement method 56, shown in FIG. 7, includes a sampling step 58 which samples at a first, second, and third sampling rate to obtain a first, second, and third time-domain sample set of a periodic signal. These time-domain sample sets are converted in a converting step 60 to respective first, second, and third frequency-domain sample sets. The embodiment further comprises the step of determining 62 a respective alias frequency for each of the frequency-domain sample sets.

More particularly, first, second, and third alias frequencies are preferably determined for the first, second, and third frequency-domain sample sets, respectively. From these three alias frequencies, the frequency measurement method selects a subset of two of these alias frequencies as shown in block 64. Utilizing this subset, the frequency measurement method 56 determines the frequency of the periodic signal as shown in block 66.

In the above embodiment, the frequency of the periodic signal is determined in the determining step 66 by the use of an algorithm. This algorithm is based on the principle illustrated in FIG. 1. However, since the frequency of the periodic signal is unknown prior to sampling of the frequency, the current algorithm uses three sample sets of the signal in order to determine its frequency. As illustrated by the derivations of this algorithm, at least three sample sets obtained at three different sample rates are needed to insure that the frequency of the periodic signal can be determined even if the frequency is somewhat larger than the nyquist frequency of the analog to digital converter.

Figure 8:
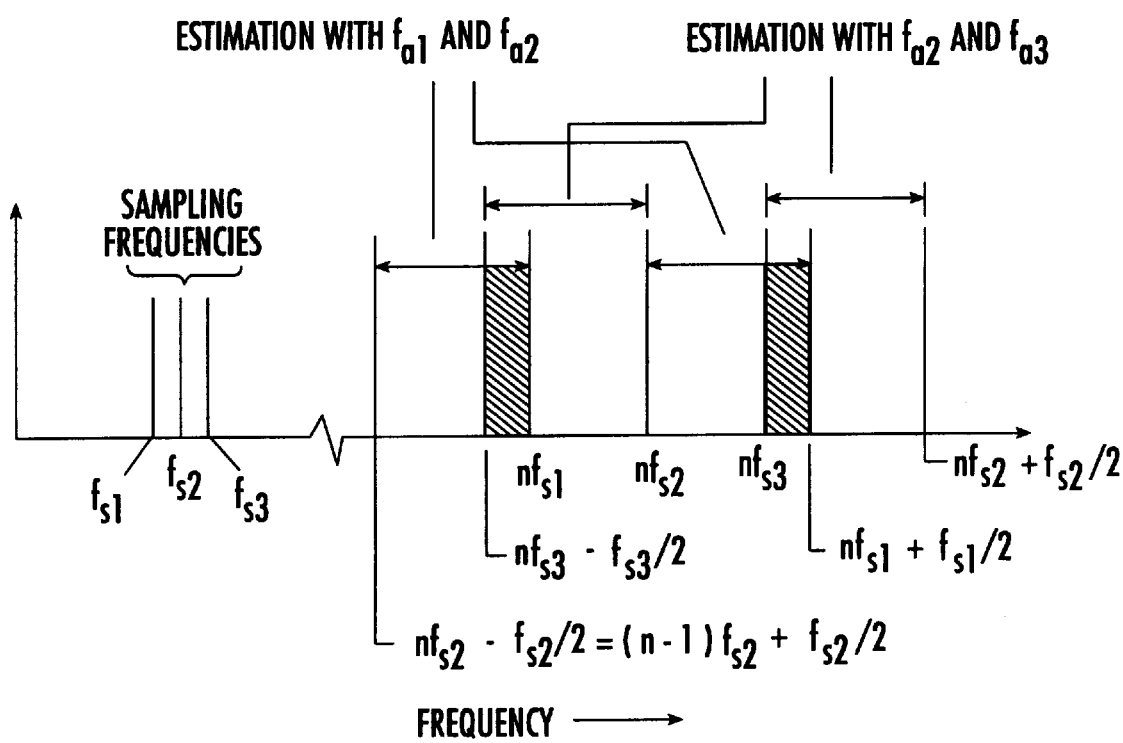
FIG. 8 is a graphic representation of the ranges where the determination of the frequency of a periodic signal is attainable.

In conjunction with FIG. 8, the derivation of the algorithm for determining the frequency of the periodic signal is shown for instances where the alias frequencies $f_{a1}$, $f_{a2}$, and $f_{a3} > 0$. As stated above, the frequency measurement method samples the periodic signal at three sample rates signified as $f_{s1}$, $f_{s2}$, $f_{s3}$, respectively, see FIG. 7. The alias signals produced at these three sampling rates are determined by the determining step 62. As seen graphically from FIG. 1, the value of the first two alias frequencies can be described by the following equations:

$$f_{a1} = |f - nf_{s1}| \quad (1)$$

$$f_{s2} = |f - nf_{s2}| \quad (2)$$

wherein:
f=signal frequency
$f_{s1}$, $f_{s2}$=sampling rates
  in which $f_{s1} < f_{s2}$
$nf_{s1}$, $nf_{s2}$=sampling rate harmonics nearest the signal frequency From equations (1) and (2), the harmonic n of the sampling rate closest to the frequency of the signal can be determined. Thus, the value of n is determined by:

$$n = \left| \frac{f_{a2} - f_{a1}}{\Delta f} \right| \quad (3)$$

where $\Delta f = f_{s2} - f_{s1}$

With knowledge of the sampling rate harmonic closest to the frequency of the periodic signal and the alias frequencies associated with that sampling rate, the signal frequency of the periodic signal can then be determined as:

$$f = nf_{s1} \pm f_{a1} \quad (4)$$

or $$f = nf_{s2} \pm f_{a2} \quad (5)$$

or with improved accuracy by averaging these expressions to obtain $$f = nf_{s1} + \frac{f_{s2}}{2} \pm \frac{f_{a1} + f_{a2}}{2} \quad (6)$$

The sign ambiguity in the above equation is due to uncertainty as to whether the harmonics $nf_{s1}$ and $nf_{s2}$ are above or below the signal frequency. The sign is resolved by noting that when the signal frequency is less than the nearest sample rate harmonic $nf_{s1}$, then because $nf_{s2} > nf_{s1}$, the difference between $f_{a2} - f_{a1}$ is a positive value and thus the negative sign in (6) is used. In other words, if $f_{a2} - f_{a1} > 0$, then use subtraction in equation (6), while if $f_{a2} - f_{a1} \leq 0$, then use addition.

The equations (3) and (6) must also be compensated to ensure that n is an integer. Thus, the equation (3) must be rounded to the nearest integer as indicated by the prefix (Rnd) in equation 7 hereinbelow. This restraint also causes equation (6) to be an estimation signified by (^). Therefore, equations (3) and (6) become:

$$\hat{n} = Rnd\left(\left|\frac{f_{a2} - f_{a1}}{\Delta f}\right|\right) \quad (7)$$

$$\hat{f} = \hat{n}f_{s1} + \frac{f_{s2}}{2} \pm \frac{f_{a1} + f_{a2}}{2} \quad (8)$$

(if $f_{a2} - f_{a1} > 0$, then use subtraction, while if $f_{a2} - f_{a1} \leq 0$, then use addition).

Although the above equations will determine the frequency of a periodic signal, these equations are limited to frequency determinations for frequencies in the range of:

$$nf_{s2} - \frac{f_{s2}}{2} < f < nf_{s1} \quad (9)$$

and $$nf_{s2} < f < nf_{s1} + \frac{f_{s1}}{2} \quad (10)$$

This range is represented graphically in FIG. 8.

To provide frequency determinations for frequencies which do not lie in the above ranges, the method uses a third data sample set, sampled at a third data sample rate $f_{s3}$. Corresponding to the above equations, f can be determined based upon $f_{s3}$ by equations:

$$n = \left|\frac{f_{a3} - f_{a2}}{\Delta f}\right| \quad (11)$$

$$f = nf_{s3} + \frac{f_{s2}}{2} \pm \frac{f_{a3} + f_{a2}}{2} \quad (12)$$

(if $f_{a3} - f_{a2} > 0$, then use subtraction, while if $f_{a3} - f_{a2} \leq 0$, then use addition).

The equations (11) and (12) must also be compensated to ensure that n is an integer. Thus, the equation (11) must be rounded to the nearest integer. This restraint also causes equation (12) to be an estimation signified by (^). Therefore, equations (11) and (12) become:

$$\hat{n} = Rnd\left(\left|\frac{f_{a3} - f_{a2}}{\Delta f}\right|\right) \quad (13)$$

-continued $$\hat{f} = \hat{n}f_{s3} + \frac{f_{s2}}{2} \pm \frac{f_{a3} + f_{a2}}{2} \quad (14)$$

(if $f_{a3}-f_{a2}>0$, then use subtraction, while if $f_{a3}-f_{a2}\leq 0$, then use addition).

Using these equations, it can be shown that the frequency of the periodic signal can be determined where the frequency is in the ranges of:

$$nf_{s3} - \frac{f_{s3}}{2} < f < nf_{s2} \quad (15)$$

and $$nf_{s3} < f < nf_{s2} + \frac{f_{s2}}{2} \quad (16)$$

These ranges are also illustrated on FIG. 8.

The regions over which the signal frequency can be estimated as defined by equations (9), (10), (15), and (16) are shown in FIG. 8. In order to assure complete coverage, the upper edge of the left most region, defined by equation (9), must be equal to or greater than the lower edge of the next higher region, defined by equation (15); that is $$nf_{s1} \geq nf_{s3} - \frac{f_{s3}}{2} \quad (17)$$

Similarly, the upper edge of the region immediately to the right of $nf_{s2}$, defined by equation (10), must be equal to or greater than the lower edge of the right most region, defined by equation (16); that is $$nf_{s1} + \frac{f_{s1}}{2} \geq nf_{s3} \quad (18)$$

Studying the ranges of determinable frequencies shown in FIG. 8, it is seen that complete coverage is accomplished. From FIG. 8, it is noticed that for any given frequency of a periodic signal within the range of:

$$nf_{s2}-(f_{s2}/2)<f<nf_{s2}+(f_{s2}/2) \quad (19)$$

the frequency can be determined from the analysis of these three samples.

However, it is also important to determine whether the range of determinable frequencies of the harmonic n overlaps with the ranges for the harmonics (n−1) and (n+1) such that for any given value of n the frequency can be determined no matter what harmonic of the sample rates the frequency is near, so long as the frequency of the periodic signal is less than a maximum estimatable frequency $f_m$, as described below. By analyzing the (n−1) and (n+1) harmonics for the above cases, it is shown that for all values of the frequency, the frequency of the periodic signal can be determined based upon the three alias signals as shown in FIG. 8. The equations below show that the lower range limit at which the frequency can be determined for the n harmonic is equal to the highest frequency limit for the (n−1) harmonic, and the highest range limit at which the frequency can be determined for the n harmonic is equal to the highest frequency limit for the (n+1) harmonic. Thus, the frequency of the periodic signal can be determined by the three sampling rates for any given frequency. In relation to FIG. 8, $$(n-1) f_{s2}+(f_{s2}/2)=nf_{s2}-(f_{s2}/2) \quad (20)$$

and $$nf_{s2}+(f_{s2}/2)=(n+1) f_{s2}-(f_{s2}/2) \quad (21)$$

proving that for the entire range of harmonics (n=1, 2, 3, . . . ) the frequency of the periodic signal can be determined.

Although it is shown that the frequency of the signal can be determined with three sample sets, a final determination must be made as to which system of equations will be used for the calculation. As shown above, f is equal to either equation (8) or (14):

$$\hat{f} = \hat{n}f_{s1} + \frac{f_{s2}}{2} + \frac{f_{a1} + f_{a2}}{2}$$

$$\hat{f} = \hat{n}f_{s3} + \frac{f_{s2}}{2} + \frac{f_{a3} + f_{a2}}{2}$$

Thus, it must be determined in which region of the range of determinable frequencies the frequency of the periodic signal lies. In other words, does the frequency of the periodic signal lie in the range of frequencies determinable by $f_{a1}$ and $f_{a2}$, see FIG. 8, or does it lie in the range determined by $f_{a2}$ and $f_{a3}$. Further, the correct value for n, which represents the harmonic closest to the frequency of the periodic signal, must be determined by equations (7) and (13):

$$\hat{n} = Rnd\left(\left|\frac{f_{a2} - f_{a1}}{\Delta f}\right|\right)$$

$$\hat{n} = Rnd\left(\left|\frac{f_{a3} - f_{a2}}{\Delta f}\right|\right)$$

Typically, the correct value for n is the larger value determined by either of the calculation of equations (7) and (13). However, this rule does not apply in the region just below the nyquist frequency of $f_{a2}$. In this region, the difference $|f_{a2}-f_{a1}|$ is larger than the correct difference $|f_{a3}-f_{a2}|$. Accounting for this, a complete procedure for choosing the correct system of equations for calculating f can be seen as:

(a) If $$f_{a2}-f_{a1}>0 \quad (22)$$

and $$f_{a3}-f_{a2}\leq 0 \quad (23)$$

and $$|f_{a2}-f_{1a}|-f_{a2}|<\Delta f \quad (24)$$

then equations (13) and (14):

$$\hat{n} = Rnd\left(\left|\frac{f_{a3} - f_{a2}}{\Delta f}\right|\right)$$

$$\hat{f} = \hat{n}f_{s3} + \frac{f_{s2}}{2} \pm \frac{f_{a3} + f_{a2}}{2}$$

are used to calculate the frequency of the periodic signal (if $f_{a3}-f_{a2}>0$, then use subtraction, while if $fa_3\ f_{a2}<0$, then use addition), or (b) If the criteria in (a) is not satisfied, it must be determined if $|f_{a2}-f_{a1}|>|f_{a3}-f_{a2}|$. If this relationship holds true, equations (7) and (8):

$$\hat{n} = Rnd\left(\left|\frac{f_{a2} - f_{a1}}{\Delta f}\right|\right)$$

$$\hat{f} = \hat{n}\frac{f_{s1} + f_{s2}}{2} \pm \frac{f_{a1} + f_{a2}}{2}$$

are used to calculate the frequency of a periodic signal (if $f_{a2}-f_{a1}>0$, then use subtraction, while if $f_{a2}-f_{a1} \leq 0$, then use addition).

Figure 9:
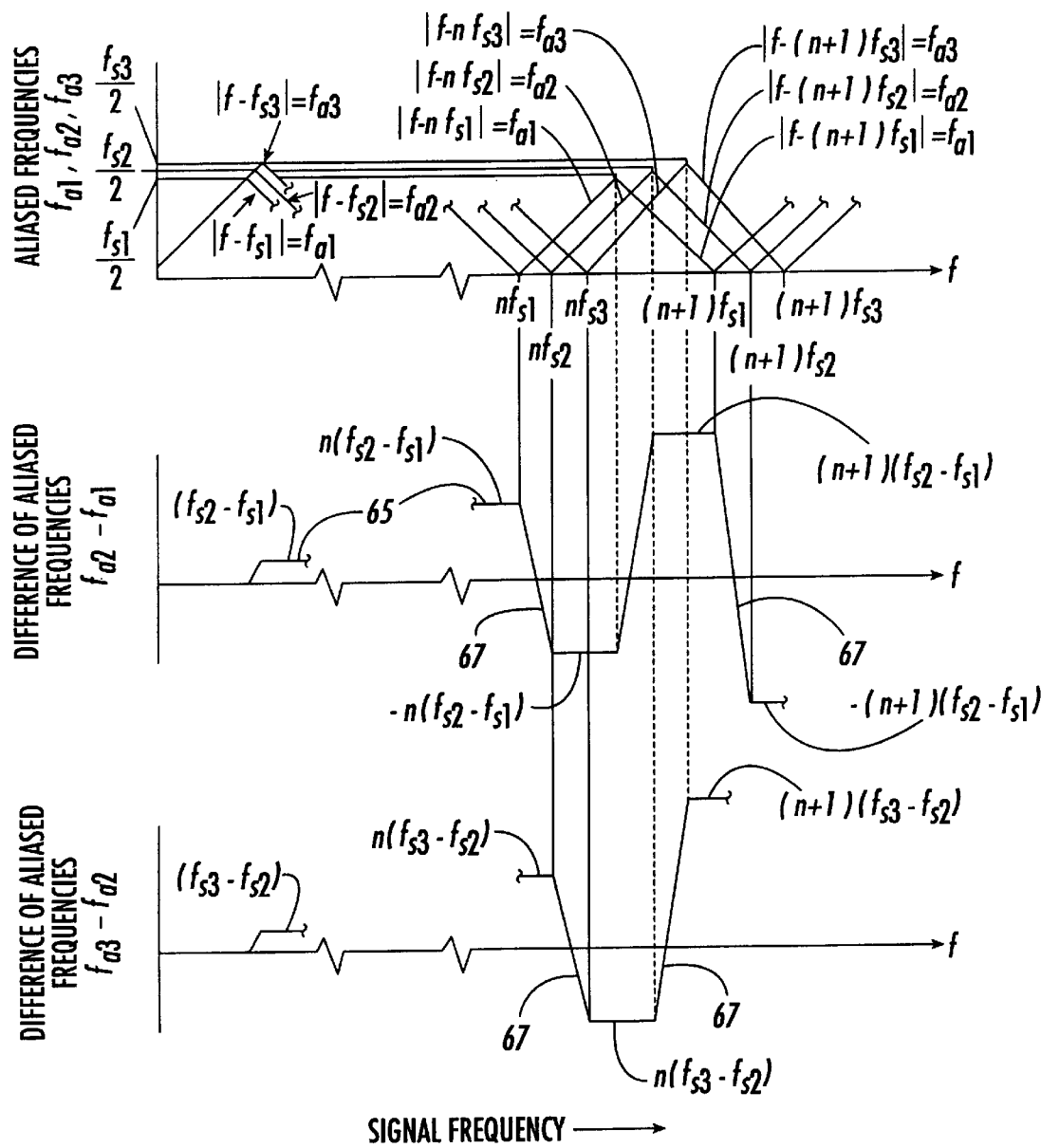
FIG. 9 is a graphic representation for determining the harmonic of the sample rate closest to the frequency of the periodic signal.

The fact that the correct value of n is typically the largest is most easily understood with the aid of the graphic development of FIG. 9. In FIG. 9, the flat regions 65 of the graph illustrate instances where the two alias frequencies, either ($f_{a1}$ and $f_{a2}$) or ($f_{a2}$ and $f_{a3}$), are on the same side of the harmonic giving the correct value for n. The sloping regions 67 illustrate instances where the two alias frequencies, either ($f_{a1}$ and $f_{a2}$) or ($f_{a2}$ and $f_{a3}$), are on opposite sides of the nyquist frequency from each other giving the incorrect value for n.

As a last consideration for the determination of the frequency using the present method, it is important to determine if any of the three alias frequencies are equal to zero. In this case, $f_{a1}, f_{a2}, f_{a3}=0$ cannot be distinguished from $f_{a1}=f_{s1}/2$ or $f_{s2}=f_{s2}/2$ or $f_{a3}=f_{s3}/2$, respectively. Resolution of this ambiguity follows by use of the other two sample rates, discussed below. If any aliased frequency=0, then if the other two aliased frequencies are nearer to half the corresponding sample rates than to zero, the zero value should be replaced with $f_{a1}/2$ or fa2/2 or $f_{a3}/2$, as applicable.

Although the above methodology determines the frequency of a periodic signal using three data samples, it does not account for errors associated with the frequency determination. The determination of the frequency of a periodic signal which exceeds the nyquist frequency of an analog to digital converter is primarily affected by two errors. The first error is a systematic method-dependent bias error $|e_B|$ that is present in the absence of noise on the input signal, i.e., the periodic signal, and results from leakage of sampled spectrum components. This error is typically negligible for most sampling rate values but is troublesome near zero and the nyquist frequency of the sample rate. Near zero and the nyquist frequency, this error can become dominant when there is a high signal to noise ratio, and when the conversion step for converting the time-domain data samples to frequency-domain samples uses shorter conversion transforms.

The second error is a random error e that is inherent in the frequency estimation method and the application of this method to signals containing noise. This error dominates the entire frequency range at low signal to noise ratio levels and is dominant every where except near zero and the nyquist frequency when the signal to noise ratio is high, but finite.

To account for these errors, a more detailed algorithm has been developed as described in detail below. As described below, these errors are collectively signified by a frequency estimation error $|e_{O,N}|$. The value of $|e_{O,N}|$ to be used in this algorithm is defined as follows:

(1) under conditions where predicted near-nyquist or near-zero aliased frequency estimation error is dominated by the bias or systematic error component, defined as $e_s$, then the error $|e_{O,N}|=|e_B|$ (2) under conditions where predicted near-nyquist or near-zero aliased frequency estimation error is dominated by the random error component, defined by e, then $|e_{O,N}|=k|e_{O,N}|$ where k is the desired statistical confidence factor.

As shown in FIG. 4, the frequency measurement apparatus preferably includes frequency estimation error determining means 122 for determining the frequency estimation error $|e_{O,N}|$ as described above. The frequency estimation error determining means is also typically embodied by a computer that operates under software control. However, the frequency estimation error determining means can be comprised of other combinations of hardware and software without departing from the spirit and scope of the present invention.

Depending on frequency estimation conditions, these errors can dominate the calculation of the frequency of the periodic signal, the frequency measurement method and apparatus of one embodiment of the present invention therefore selects the subset of alias frequencies based on these errors. As before, the frequency measurement method of this embodiment determines these alias frequencies from a plurality of alias frequencies generated during sampling of a periodic signal at a plurality of sampling rates. However, the frequency measurement method of this embodiment also determines a frequency estimation error that is at least partially based upon input signal to noise ratio, signal bandwidth, and duration of measurement interval, as described below. Utilizing this estimation error, the frequency measurement method then selects the subset of alias frequencies which are not within the frequency estimation error of either zero or the nyquist frequency associated with the sampling rate of the respective alias frequency.

Figure 10:
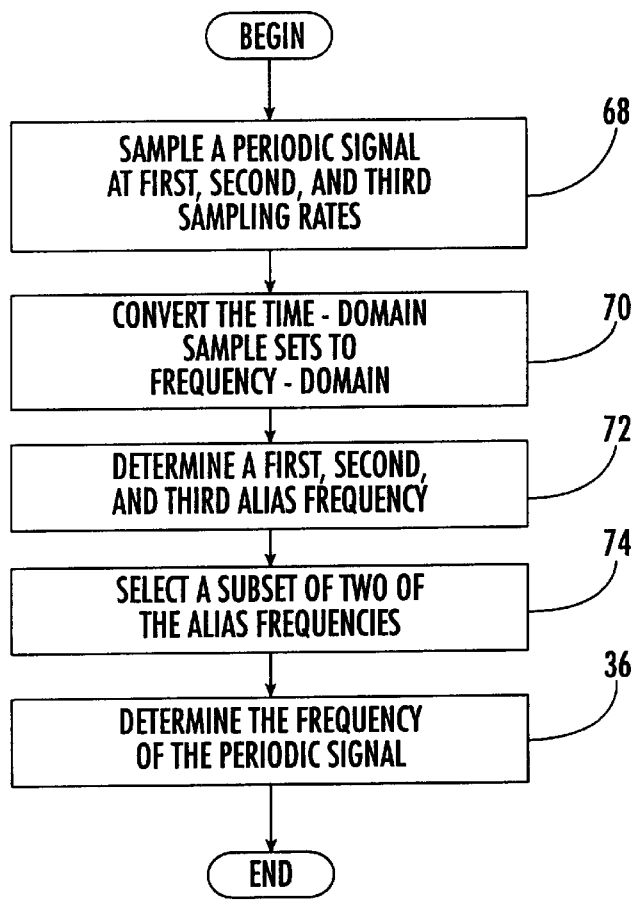
FIG. 10 is a block diagram of one embodiment of the method of FIG. 2, wherein the embodiment determines the frequency of a periodic signal based on sampling the signal at three sampling rates.

As an example of this embodiment of the frequency measurement method and apparatus, the process of selecting a subset of two alias frequencies from three alias frequencies is shown in FIG. 10. As shown in block 68, the frequency measurement method samples a periodic signal at first, second, and third sampling rates to obtain first, second, and third time-domain sample sets, respectively. These sample sets are then converted by a converting step 70 into frequency-domain sample sets. The frequency measurement method of this exemplary embodiment thereafter determines the frequency estimation error based on the input signal to noise ratio, frequency measurement method, signal bandwidth, and duration of measurement interval, as shown in block 72. Based upon the frequency estimation error, the frequency measurement method selects a subset of two of the three alias frequencies for determining the frequency of the periodic signal, as shown in block 74. Based on these alias frequencies, the method determines the frequency of the periodic signal, as described above.

The selection step 74 of the frequency measurement method of FIG. 10 selects a subset of alias frequencies so as to reduce errors, including systemic method-dependent bias errors, in the subsequent calculation of the periodic signal by partially compensating for these errors. For example, as shown in FIG. 11, the selecting step 74 selects the subset of alias frequencies based on error determinations.

Figure 11:
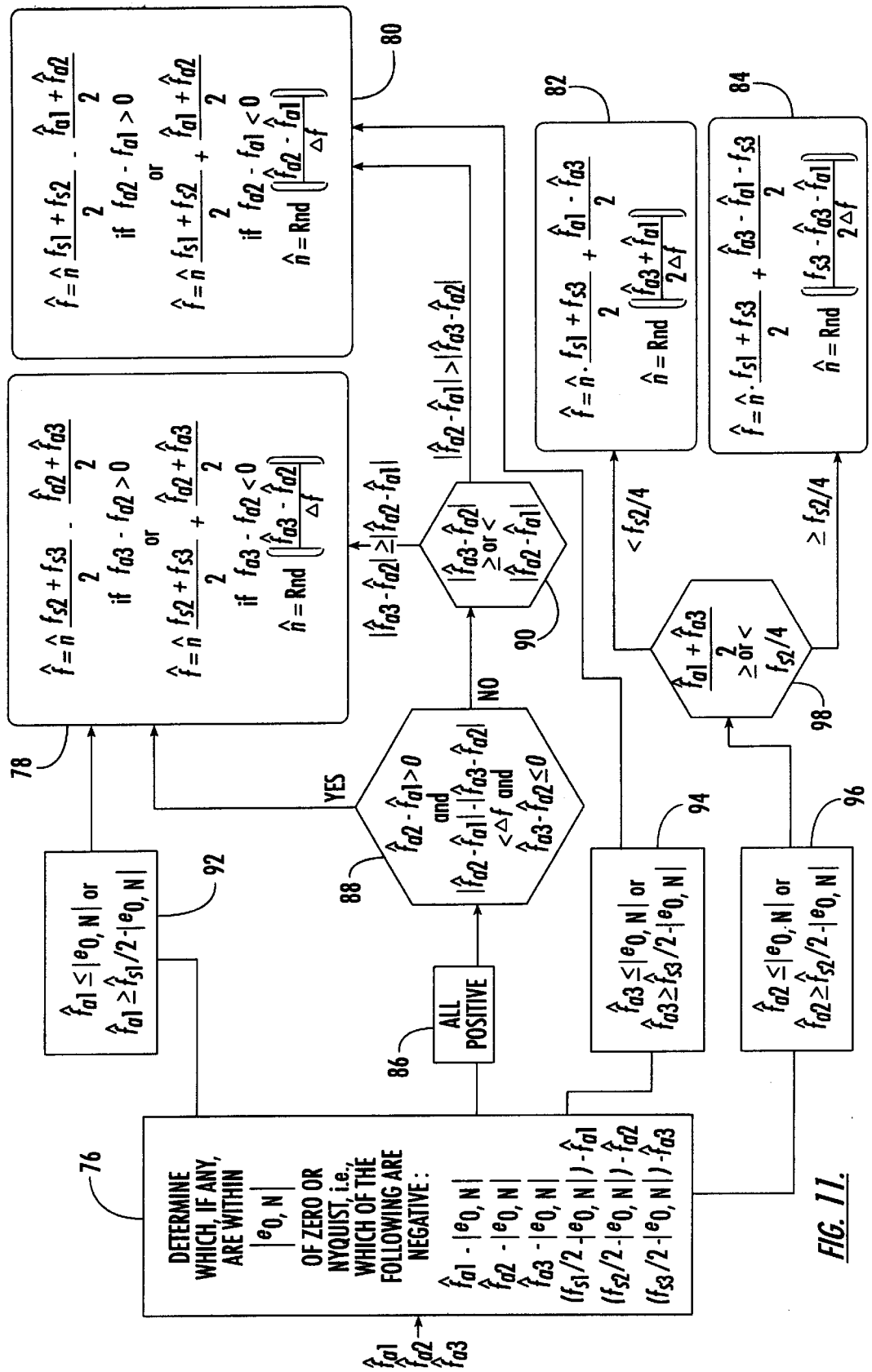
FIG. 11 is a block diagram illustrating the selection of the alias frequencies for determining the frequency of a periodic signal.

FIG. 11 illustrates the selection of the subset of alias frequencies which will be used to calculate the frequency of the periodic signal in much more detail. In block 76, the frequency measurement method determines if any of the alias frequencies are within a frequency estimation error of zero or the nyquist frequency, while blocks 78–84 represent the system of equations which are utilized depending on the subset of alias frequencies that is selected.

As discussed earlier, the most generic case is in instances in which none of the alias frequencies are within a frequency estimation error of zero or the corresponding nyquist frequency. This case is represented by block 86. In this case, the frequency measurement method determines the correct system of equations to be used in the determination of the frequency of the periodic signal as illustrated by decision block 88 and as described below:

(a) If $$f_{a2}-f_{a1}>0$$

and $$f_{a3}-f_{a2}\leq 0$$

and $$|f_{a2}-f_{a1}|-|f_{a3}-f_{a2}|<\Delta f$$

then the equations of block 78 are selected. The equations of block 78 are set forth below and correspond to equations (13) and (14):

$$\hat{n} = Rnd\left(\left|\frac{f_{a3}-f_{a2}}{\Delta f}\right|\right)$$

$$\hat{f} = \hat{n}\frac{f_{s3}+f_{s2}}{2} + \frac{f_{a3}+f_{a2}}{2}$$

(if $f_{a3}-f_{a2}>0$, then use subtraction; otherwise use addition).

Alternatively, if these criteria are not met, the frequency measurement method proceeds to decision block 90 which determines whether:

(b)

$$|f_{a2}-f_{a2}|>|f_{a3}-f_{a2}|$$

If this relationship is true, the equations of block 80 are selected which corresponds to equations (7) and (8) reproduced below:

$$\hat{n} = Rnd\left(\left|\frac{f_{a2}-f_{a1}}{\Delta f}\right|\right)$$

$$\hat{f} = \hat{n}\frac{f_{s1}+f_{s2}}{2} + \frac{f_{a1}+f_{a2}}{2}$$

to calculate the frequency of a periodic signal (if $f_{a2}-f_{a1}>0$, then use subtraction; otherwise use addition).

An exception to the generic case occurs where one of the alias frequencies is within a frequency estimation error of zero or the nyquist frequency. This determination is illustrated by block 76 in FIG. 11. If it is determined that the first alias frequency $f_{a1}$ is within a frequency estimation error of zero or the nyquist frequency established by the first sample rate, the frequency measurement method selects the second and third alias frequencies. This selection is signified by block 92, and the frequency of the periodic signal is determined by equations (13) and (14), represented in block 78:

$$\hat{n} = Rnd\left(\left|\frac{f_{a3}-f_{a2}}{\Delta f}\right|\right)$$

$$\hat{f} = \hat{n}\frac{f_{s3}+f_{s2}}{2} \pm \frac{f_{a3}+f_{a2}}{2}$$

(if $f_{a3}-f_{a2}>0$, then use subtraction; otherwise use addition).

Likewise, the frequency measurement method selects the first and second alias frequencies if it is determined in block 76 that the third alias frequency is within a frequency estimation error of either zero or the nyquist frequency established by said third sample rate. This determination is signified by block 94 and the frequency of the periodic signal is determined by equations (7) and (8) in block 80:

$$\hat{n} = Rnd\left(\left|\frac{f_{a2}-f_{a1}}{\Delta f}\right|\right)$$

$$\hat{f} = \hat{n}\frac{f_{s1}+f_{s2}}{2} \pm \frac{f_{a1}+f_{a2}}{2}$$

(if $f_{a2}-f_{a1}>0$ then use subtraction; otherwise use addition).

An added concern occurs, however, where the frequency measurement method determines in block 76 that $f_{a2}$ is within a frequency estimation error of either zero or the nyquist frequency, see block 96. In this instance, the frequency measurement method preferably determines whether the alias frequency $f_{a2}$ is either close to zero or close to the nyquist frequency. This determination is shown in decision block 98. When $f_{a2}$ is within a frequency estimation error of zero, the determination of the frequency of the periodic signal using alias frequencies $f_{a1}$ and $f_{a3}$ is determined by the equations of block 82 as follows:

$$\hat{n} = Rnd\left(\left|\frac{f_{a1}+f_{a3}}{2\Delta f}\right|\right)$$

$$\hat{f} = \hat{n}\frac{f_{s1}+f_{s3}}{2} + \frac{f_{a1}-f_{a3}}{2}$$

However, if the alias frequency $f_{a2}$ is within a frequency estimation error of the nyquist frequency, the calculation of the frequency of the periodic signal using alias frequencies $f_{a1}$ and $f_{a3}$ is determined by the equations of block 84 as follows:

$$\hat{n} = Rnd\left(\left|\frac{f_{s3}-f_{a3}-f_{a1}}{2\Delta f}\right|\right) \quad (28)$$

$$\hat{f} = \hat{n}\frac{f_{s1}+f_{s3}}{2} + \frac{f_{a3}-f_{a1}-f_{s3}}{2}$$

As illustrated above, if $f_{a2}$ is within the frequency estimation error $|e_{O,N}|$ of zero or the nyquist frequency, the frequency measurement method preferably determines which of these two conditions exists. The derivation of the above equations (25), (26), (27), and (28) for these two conditions are shown by the following method.

The condition of proximity of $f_{a2}$ to zero or the nyquist frequency is detectable from the aliased frequency estimates as follows:

$$\hat{f}_{ai}<|e_{O,N}| \quad (29)$$

or $$\hat{f}_{ai}\geq f_{si}/2-|e_{O,N}| \quad (30)$$

respectively, where the symbol A denotes estimation, $|e_{O,N}|$=predicted frequency error near zero or nyquist and i=1, 2, 3, . . . .

Based upon equations (29) or (30), it can be determined if any of the aliased frequencies is within $|e_{O,N}|$ of zero or the nyquist frequency. If none are within $|e_{O,N}|$ of zero or the nyquist frequency, then estimation proceeds as described above with equations (8) or (14):

$$\hat{f} = \hat{n}\frac{f_{s1} + f_{s2}}{2} + \frac{f_{a1} + f_{a2}}{2}$$

(if $f_{a2}-f_{a1}>0$, then use subtraction; otherwise use addition).

$$\hat{f} = \hat{n}\frac{f_{s3} + f_{s2}}{2} + \frac{f_{a3} + f_{a2}}{2}$$

(if $f_{a3}-f_{a2}>0$, then use subtraction; otherwise use addition).

However, if one of the alias frequencies is within $|e_{O,N}|$ of zero or the respective nyquist frequency, then the other two frequencies are selected in order to calculate the frequency of the periodic signal, since sample rates are preferably constrained such that only one alias frequency will be within a frequency estimation error of zero or the nyquist frequency. For example, if $f_{a1}$ is within $|e_{O,N}|$ of zero or the nyquist frequency ($f_{s1}/2$), then the alias frequencies $f_{a2}$ and $f_{a3}$ will be selected as described above in conjunction with equation (14) (e.g., use equation (14) to calculate the frequency of the signal).

Similarly, if $f_{a3}$ is within $|e_{O,N}|$ of zero or the nyquist frequency ($f_{s3}/2$), then alias frequencies $f_{a1}$ and $f_{a2}$ are selected as described above in conjunction with equation (8) (e.g., use equation (8) to calculate the frequency of the signal).

However, if $f_{a2}$ is within $|e_{O,N}|$ of zero or the nyquist frequency ($f_{s2}/2$), it is necessary to determine which of these two conditions exists. This determination can be deduced from the average of $f_{a1}$ and $f_{a3}$ because this average provides an estimate of the lower bound of $f_{a2}$. Therefore, when $f_{a2}$ is nearer to the nyquist frequency ($f_{s2}/2$) than to zero:

$$\frac{f_{a1} + f_{a3}}{2} > \frac{f_{s2}}{4} \tag{31}$$

The fact that this average provides a sufficiently accurate lower-bound estimate of $f_{a2}$ under nyquist conditions results from the following reasoning: a) $f_{a2}>f_{a1}$, b) $f_{a2} \geq f_{a3}$ because $f_{a3}$ is folded below $f_{s3}/2$ by at least $\Delta f/2$ (see FIG. 9), c) the spacing between $f_{a1}$ and $f_{a2}$ is bounded by $n\Delta f$, d) from the relationship of equation (18) which provides a stronger constraint than equation (17) and $f_{s2}=f_{s1}+\Delta f=f_{s3}-\Delta f$:

$$n\Delta f \geq f_{s2}/4 - \Delta f/4$$

and e) from the following equation:

$$\Delta f \geq 2k|\sqrt{2}\, e| \tag{32}$$

(discussed later in the derivation of $\Delta f$) it follows that the error in estimation of $f_{a1}$ and $f_{s3}$ is less than $\Delta f/4$ for any useful choice of the confidence factor defined there. Similarly, if $$\frac{f_{a1} + f_{a3}}{2} < f_{s2}/4 \tag{33}$$

then $f_{a2}$ is nearer to zero than to nyquist ($f_{s2}/2$).

Considering the case when $f_{a2}$ is nearer zero and with sample rates constrained such that only one alias frequency will be within a frequency estimation error of zero or the nyquist frequency ensuring that $f_{a2}$ is within $n\Delta f$ of zero, it can be seen from FIG. 13B that $$2n\Delta f = f_{a1} + f_{a3} \tag{34}$$

which leads to:

$$n = \text{Rnd}\left(\left|\frac{f_{a1} + f_{a3}}{2\Delta f}\right|\right)$$

(equation 25 discussed earlier)
such that the estimated frequency is:

$$\hat{f} = \hat{n}f_{s1} + \hat{f}_{a1} \tag{35}$$

or $$\hat{f} = \hat{n}f_{s3} - \hat{f}_{a3} \tag{36}$$

or with improved accuracy from the average of these expressions:

$$\hat{f} = \hat{n}f_{s1} + \frac{f_{s3}}{2} + \frac{f_{a1} - f_{a3}}{2} \tag{37}$$

Figure 12A:
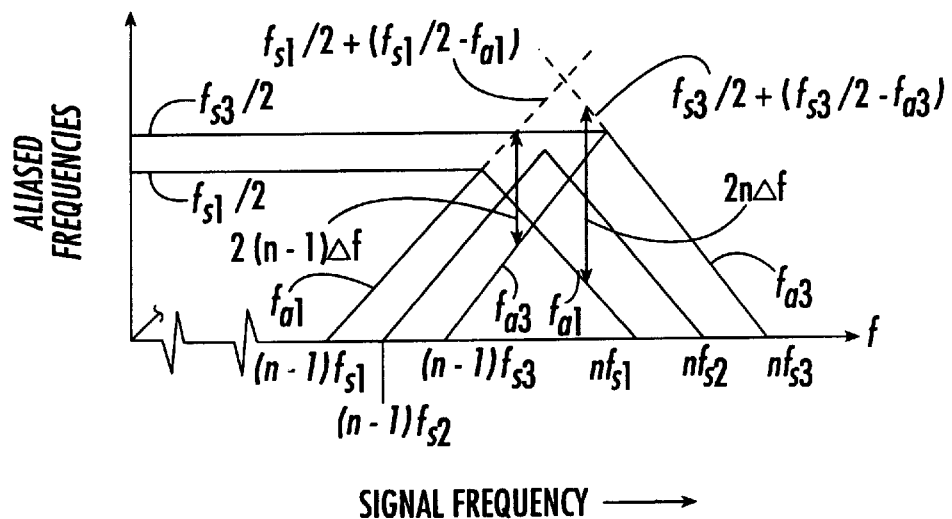
FIGS. 12A and 12B are graphic representations for finding the harmonic n that is closest the frequency of the periodic signal.
Figure 12B:
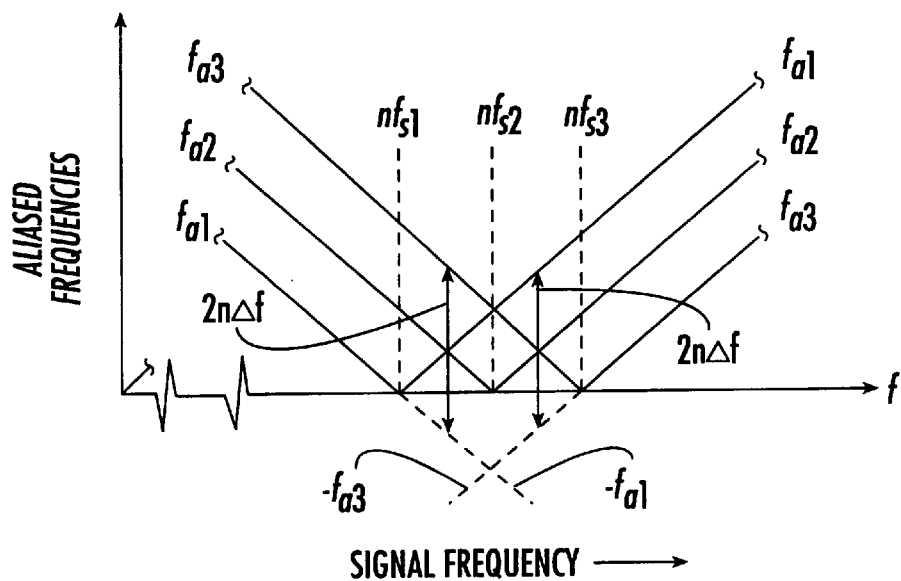

(equation (26) discussed earlier)
When $f_{a2}$ is near nyquist ($f_{s2}/2$) and subject to the constraints that only one alias frequency will be within a frequency estimation error of zero or the nyquist frequency, it can be seen from FIG. 12A that because $f_{a2}$ is within the dashed-line region:

$$2n\Delta f = f_{s3} - f_{a3} - f_{a1} \tag{37}$$

and $$2(n-1)\Delta f = f_{s1} - f_{a3} - f_{a1} \tag{38}$$

but since $f_{s3}=f_{s1}+2\Delta f$, equations (37) and (38) are equal. From these results:

$$\hat{n} = \text{Rnd}\left(\left|\frac{f_{s3} - f_{a3} - f_{a1}}{2\Delta f}\right|\right) \tag{39}$$

(equation (27) discussed earlier)
such that the estimated frequency is $$\hat{f} = \hat{n}f_{s1} - f_{a1} \tag{39}$$

or $$\hat{f} = (\hat{n}-1)f_{s3} + f_{a3} + \hat{n}f_{s3} - f_{s3} + f_{a3} \tag{40}$$

or with greater accuracy from the average of these expressions:

$$\hat{f} = \hat{n}f_{s1} + \frac{f_{s3}}{2} + \frac{f_{a3} - f_{a1} - f_{s3}}{2} \tag{41}$$

(equation (28) discussed earlier)

A main purpose of the frequency measurement method and apparatus of the present invention is to reduce error and provide a more accurate estimation of the frequency of the periodic signal. To accomplish these goals, the present invention also provides methods for determining proper sampling rates which should be utilized to sample the periodic signal in order to minimize the resulting error. The determination for the sample rates are at least partially based on the maximum estimatable frequency, estimation errors, and the frequency sample separation increment.

Figure 13:
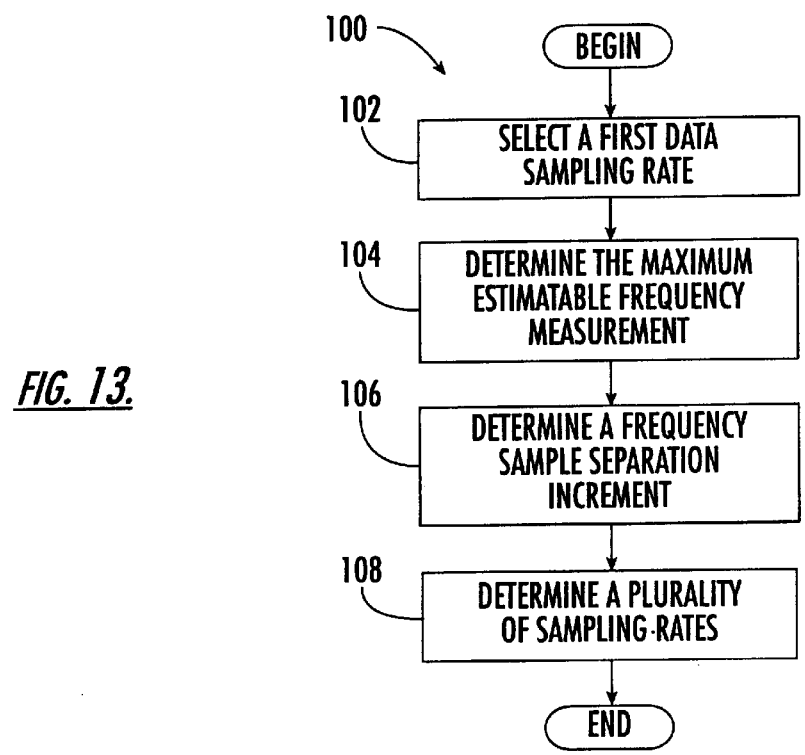
FIG. 13 is a block diagram of a method for selecting a plurality of sample rates to sample a periodic signal.

Thus, one embodiment of the frequency measurement method and apparatus 100 of the present invention selects a plurality of data sampling rates for determining the frequency of a periodic signal as shown in FIG. 13. This embodiment of the frequency measurement method and apparatus selects a first data sampling rate fsmax wherein this first data sampling rate is the largest of the plurality of data sampling rates to be selected. See block 102. The frequency measurement method and apparatus then determines the maximum frequency of the periodic signal that can be estimated, hereinafter termed the maximum estimatable frequency. See block 104. The frequency measurement method and apparatus then determines a frequency sample separation increment Δf which is based on the value of the maximum estimatable frequency, the first data sampling rate, and the lowest desired estimatable frequency. See block 106. Using the first data sampling rate, the maximum estimatable frequency, and the lowest desired estimatable frequency, the frequency measurement method and apparatus of this embodiment determines a plurality of sampling rates $f_i$, where the sampling rates are determined as follows:

$$f_i = f_{smax} - (i * \Delta f)$$

where $f_{smax}$=first (maximum) sampling rate
i=(1, 2, 3, . . . ).

As shown in FIG. 4, the frequency measurement apparatus preferably includes sample rate selection means 120 for selecting the plurality of data sampling rates, as described above and as illustrated by FIG. 13. The sample rate selection means is also typically embodied by a computer that operates under software control. However, the sample rate selection means can be comprised of other combinations of hardware and software without departing from the spirit and scope of the present invention.

For illustration purposes, one embodiment of the frequency measurement method and apparatus is described which sets forth the derivation of the maximum estimatable frequency, the frequency separation increment, and the sampling rates for a system which uses three sampling rates to determine the frequency of a periodic signal. In this embodiment, the frequency measurement method and apparatus determines the maximum estimatable frequency fM by selecting one of the following two equations which produces the smallest value of $f_M$.

$$f_M \leq \left(\frac{f_{s3}}{2}\right)\left[\left(\frac{f_{s3}}{2}\right) / \left(\frac{2|e_{o,N}|}{f_L/f_{s3}+1/2}\right) - \frac{1}{2}\right] \quad (41)$$

and $$f_M \leq \left(\frac{f_{s3}}{2}\right)\left[\left(\frac{f_{s3}}{2}\right) / (2K|\sqrt{2}\,e|) - \frac{1}{2}\right] \quad (42)$$

where
  $f_L$=desired minimum or lowest estimatable frequency ($f_L$=0, $f_3$/2, $f_3$, 3$f_3$/2 . . . ) that is selected by the system designer;
  $f_{s3}$=maximum sampling rate.

As seen from the above equations, the spacing between the sample rates is termed the frequency sample separation increment Δf. The frequency sample separation increment is determined by:

$$\frac{f_{s3}/2}{f_M/(f_{s3}/2)+0.5} \leq \Delta f \leq \frac{f_{s3}/2}{f_D/(f_{s3}/2)+0.5} \quad (43)$$

wherein $f_D$ is a desired maximum estimable frequency selected by the system designer.

By way of further explanation, the derivation of the maximum estimatable frequency ($f_M$) and frequency sample separation increment (Δf) are as follows:

The relationship of equations (41), (42), and (43) are derived by first determining the relationship between Δf and the desired and maximum estimatable frequencies as used in equation (43). The relationship among Δf, errors and the desired minimum estimatable frequency is discussed later.

The derivation of the maximum estimatable frequency versus Δf is begun by noting that the maximum value of n can be found by observing that because $f_{s1}=f_{s3}-2\Delta f$, then the constraint in equation (18):

$$nf_{s1} + \frac{f_{s1}}{2} \geq nf_{s3}$$

becomes $$n \leq \frac{f_{s3}}{4\Delta f} - \frac{1}{2} \quad (45)$$

Noting that from equation (16)

$$f \leq nf_{s2} + \frac{f_{s3}}{2} \quad (46)$$

then from equations (44), (45) and the relationship, $f_{s2}f_{s3}-\Delta f$:

$$f \leq \frac{f_{s3}^2}{4\Delta f} - \frac{f_{s3}}{4} \quad (47)$$

Defining $f=f_u$, where $f_u$=upper bound on frequency extension, equation (47) becomes:

$$f_u = \left(\frac{f_{s3}}{2}\right)\left[\left(\frac{f_{s3}}{2}\right)/\Delta f - \frac{1}{2}\right] \quad (48)$$

or $$\Delta f = \frac{f_{s3}/2}{f_u/(f_{s3}/2)+0.5} \quad (49)$$

The bounds on Δf of equation (43) result from the requirement that $f_u$ be at least as large as the desired estimatable frequency $f_D$, but can be no larger than the maximum estimatable frequency $f_M$.

The frequency sample separation increment (Δf) between sample rates results from two requirements: (a) the requirement to ensure that no more than one alias frequency estimate can fall within $|e_{O,N}|$ of zero or the nyquist frequency, and (b) the requirement for unambiguous estimation of "n".

Figure 14:
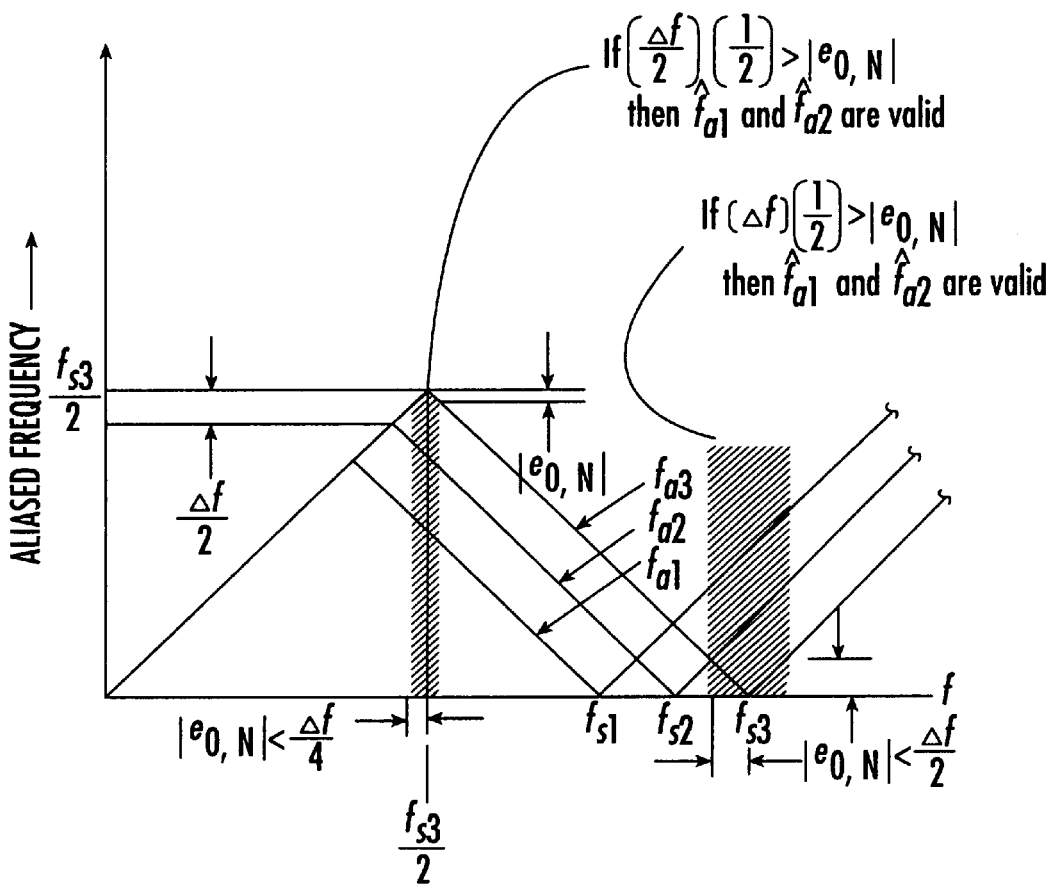
FIG. 14 is a graphic representation of the relationship between near-nyquist and near zero error and frequency sample separation increment.

The requirement that no more than one aliased frequency estimate falls within $|e_{O,N}|$ of zero or the nyquist frequency leads to the construction of FIG. 14. From this figure and FIG. 9, it is seen that if $$|e_{O,N}|<(\Delta f/2)\,(f_L/f_{s3}+1/2) \quad (50)$$

where $f_L$=lowest frequency to be estimated ($f_L$=0, $f_{s3}$/2, $f_{s3}$), then if one of the alias frequency estimates falls within $|e_{O,N}|$ of zero or the nyquist frequency, the other two alias frequency estimates will be valid, i.e., not within $|e_{O,N}|$ of zero or the respective nyquist frequency. The case $f_L/f_{s3}$=0 is shown as the left shaded area. At each increase of $f_L/f_{s3}$ by $f_{s3}$/2, the allowable error increases by $\Delta f/2$. In terms of $\Delta f$, equation (50) becomes:

$$\Delta f > 2|e_{O,N}|/(f_L/f_{s3}+1/2) \quad (51)$$

Inequality (41) is obtained by combining equations (48) and (50).

Unambiguous estimation of "n" also imposes a constraint on frequency spacing $\Delta f$. Invoking the requirement that n must be an integer, then from equations (7) and (13):

$$\hat{n} = \text{Rnd}\left(\left|\frac{f_{a2} - f_{a1}}{\Delta f}\right|\right)$$

or $$\hat{n} = \text{Rnd}\left(\left|\frac{f_{a3} - f_{a2}}{\Delta f}\right|\right)$$

where Rnd denotes rounding to the nearest integer. Although either equation (7) or equation (13) can be used in the following derivation, equation (7) will be used for purposes of illustration and can be written:

$$\hat{n} = \text{Rnd}\left(\left|\frac{f_{a2} + e_2 - (f_{a1} + e_1)}{\Delta f}\right|\right) \quad (52)$$

$$= \text{Rnd}\left(\left|n + \frac{e_2 - e_1}{\Delta f}\right|\right)$$

where $e_2$ and $e_1$ are the errors in the estimates of $f_{a1}$ and $f_{a2}$, respectively, in instances in which the aliased frequency estimates are between the limits imposed by equations (29) and (30), i.e., are not located near zero or the nyquist frequency.

In order that the estimate of n be sufficiently accurate, $$\left|\frac{e_2 - e_1}{\Delta f}\right| < \frac{1}{2} \quad (53)$$

Denoting the rms amplitude of the independent random components of $e_1$ and $e_2$ that are assumed to be equal and uncorrelated by "e", equation (53) becomes:

$$\Delta f > 2|\sqrt{2}\, e| \quad (54)$$

Allowing a statistical confidence factor k for this random error, equation (55) is obtained as follows:

$$\Delta f \geq 2k|\sqrt{2}\, e| \quad (55)$$

Inequality (42) is then obtained by combining equations (55) and (48).

As described above, the method and apparatus of the present invention converts a time-domain sample set into a frequency-domain sample set. The conversion is usually performed by a digital signal processor, such as a fast fourier transform processor, or other combinations of hardware and software. As known to those skilled in the art, a fourier transform is a conversion method which converts a time-domain sample set into a frequency-domain sample set. As with most transform methods, the longer conversion transforms that can be used increases the accuracy of the approximation. However, the use of longer transforms can limit the capability of the converter by increasing the time required for conversion. Thus, a system designer must evaluate the desired accuracy of the conversion method against other parameters, such as processing time, to determine the frequency of the periodic signal.

Figure 15:
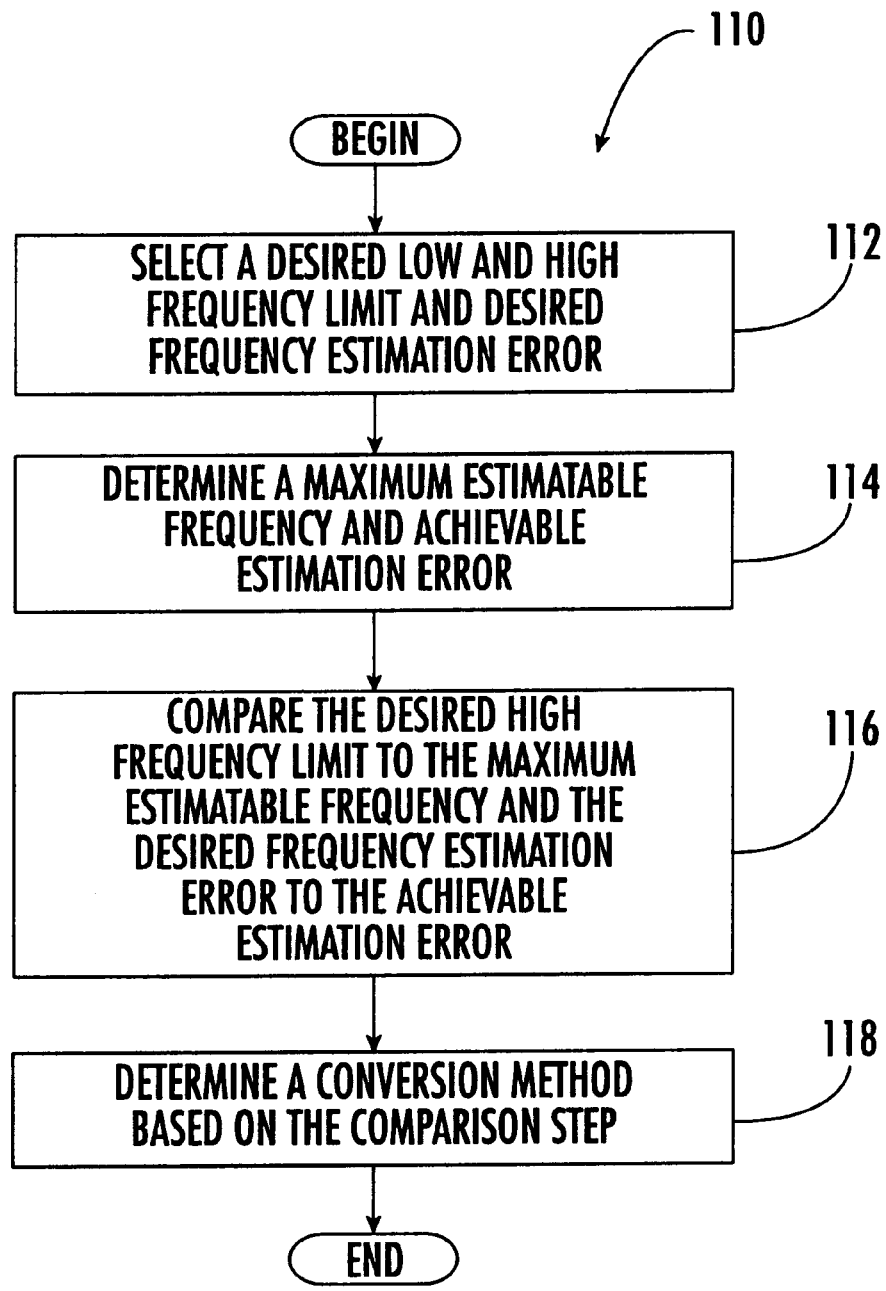
FIG. 15 is a block diagram of a method for selecting a conversion routine for converting a time-domain sample to frequency-domain.

Accordingly, one embodiment of the frequency measurement method and apparatus of the present invention selects one of a plurality of conversion routines as shown in block 110 of FIG. 15. This selection process includes the step 112 of selecting a desired low and high frequency limit, and a desired frequency estimation error limit. Next, the frequency measurement method and apparatus of this embodiment determines a maximum estimatable frequency and an achievable frequency estimation error. See block 114. The frequency measurement method and apparatus of this embodiment then compares the desired high frequency limit and the desired frequency estimation error limit to the maximum estimatable frequency and the achievable frequency estimation error, respectively, as shown in block 116. Based on this comparison, the frequency measurement method and apparatus of this embodiment determines the appropriate conversion routine for converting each of the plurality of time-domain sample sets into respective frequency-domain sample sets. See block 118.

For purposes of further illustration, a numerical example is provided as follows:

With an A/D converter having a sampling rate $f_{s3}$=100 KHz, the frequency of a signal having a frequency that ranges from 0 Hz to 1 Mhz is preferably measured with an accuracy of 1 Hz. Typical aliased frequency estimation accuracy for these parameters with short transform-based methods is 250 Hz bias error near zero and the nyquist frequency and 0.5 Hz random error elsewhere. Assuming a conservative statistical confidence factor of four, the parameters required to estimate $f_M$ and $\Delta f$ are:

f=1,000 KHz $f_L$=0

$f_{s3}$=100 KHz $e_B$=250 Hz e=0.5 Hz

K=4

Substituting these parameters into the two expressions for the upper limit on $f_M$ shows that the first limit clearly dominates, yielding a maximum possible frequency of:

$f_M$=2.475 MHz

From this result and the above values for $f_{s3}$ and f, the range of values of $\Delta f$ are obtained as follows:

1 KHz $\leq \Delta f \leq$ 2.44 KHz

The rms precision in the estimate of extended signal frequency is:

rms error=$\pm|e|/\sqrt{2}$=0.35 Hz

Choosing the value $\Delta f$=2 KHz gives $f_{s2}$=98 KHz and $f_{s1}$=96 KHz.

Applying this system to three different input signal frequency cases of f=975 KHz, 47.9 KHz and 980 KHz, the following first order alias frequencies are produced:

for f=975 KHz:

$f_{a1}$=15 KHz $f_{a2}$=5 KHz $f_{a3}$=25 KHz, for f=47.9 KHz:

$f_{a1}$=47.9 KHz
$f_{a2}$=47.9 KHz
$f_{a3}$=47.9 KHz,
for f=980 KHz:
$f_{a1}$=20 KHz
$f_{a2}$=0 KHz
$f_{a3}$=20 KHz.

Allowing for error, typical estimates for these frequencies might be:
$\hat{f}_{a1}$=14,999.5
$\hat{f}_{a2}$=5,000.4
$\hat{f}_{a3}$=24,999.4 and
$\hat{f}_{a1}$=47,800
$\hat{f}_{a2}$=47,000.4
$\hat{f}_{a3}$=47,899.4 and
$\hat{f}_{a1}$=9,999.4
$\hat{f}_{a2}$=150.0
$\hat{f}_{a3}$=20,000.5 respectively.

In this system, $|e_B| \gg K|e|$, so $|e_{O,N}|$=250 Hz.

In the first case in which f=975 KHz, it can be determined that all three alias frequency estimates are valid, i.e. separated by more than 250 Hz from zero or the respective nyquist frequency of 48 KHz, 49 KHz, and 50 KHz, respectively. As such, the frequency measurement method and apparatus will proceed to measure the frequency of the signal as 975,000.1 Hz, thereby creating an error of 0.1 Hz.

In the second case in which f=47.9 KHz, it can be determined that $\hat{f}_{a1}$ is within $|e_{O,N}|$=250 Hz of the respective nyquist frequency. By utilizing $\hat{f}_{a2}$ and $\hat{f}_{a3}$, the frequency measurement method and apparatus will proceed to measure the frequency of the signal as 47,899.9 Hz, thereby creating an error of 0.1 Hz.

In the third case in which f=980 KHz, it can be determined that $\hat{f}_{a2}$ is within $|e_{O,N}|$ of zero. After determining that $\hat{f}_{a2}$ is actually nearer to zero than to the respective nyquist frequency, the frequency measurement method and apparatus will proceed to measure the frequency of the signal as 979,999.45 Hz; thereby creating an error of 0.55 Hz.

Alternatively, for an A/D converter with sampling rate of $f_{s3}$=1100 MHz, the frequency of a signal that varies between 500 MHz and 5,000 Mhz can be determined within an accuracy of 5 Mhz as described below. In this instance, typical short transform-based aliased frequency estimation errors are about 4 MHz near zero and the nyquist frequency, and about 2 MHz random throughout the aliased frequency estimate. Applying a conservative statistical confidence factor of four, the parameters needed to estimate $f_M$ and $\Delta f$ are:

f=5,000 MHz
$f_L$=500 MHz
$f_{s3}$=1000 MHz
$e_B$=4 MHz
e=2 MHz
K=4

Substituting these parameters into the two expressions for the upper limit $f_M$ shows that the third limit is most constraining, but still yields a maximum estimatable frequency of $f_M$=10,800 MHz From this result and the above values for $f_{s3}$ and f, the range of values of $\Delta f$ can be determined as follows:

22.6 MHz $\leq \Delta f \leq$ 47.6 MHz

The precision in estimation of extended frequency is:

$$\text{rms error} = |e|/\sqrt{2} = 1.41 \text{ MHz}$$

By setting $\Delta f$=40 MHz, the other sampling rates are $f_{s2}$=960 MHz and $f_{s1}$=920 MHz.

For signal frequencies of f=4,500 MHz and 4,320 MHz, the following first order alias frequencies are generated:
$f_{a1}$=100 MHz
$f_{a2}$=300 MHz
$f_{a3}$=500 MHz and
$f_{a1}$=280 MHz
$f_{a2}$=480 MHz
$f_{a3}$=320 MHz respectively. Allowing for error, actual estimates might be:
$\hat{f}_{a1}$=102.5 MHz
$\hat{f}_{a2}$=298.5 MHz
$\hat{f}_{a3}$=496.2 MHz and
$\hat{f}_{a1}$=280.6 MHz
$\hat{f}_{a2}$=3.1 MHz
$\hat{f}_{a3}$=317.9 MHz respectively.

In the first case in which f=4500 MHz, it can be determined that $\hat{f}^{a3}$ is within $|e_{O,N}|$ or 8 Mhz of the nyquist frequency. By utilizing $\hat{f}_{a1}$ and $\hat{f}_{a2}$ the frequency measurement method and apparatus will proceed to measure the frequency of the signal as 4,499.5 MHz; within 0.5 MHz of the actual frequency.

In the second case in which f=4320 MHz, it can be determined that $\hat{f}_{a2}$ is within $|e_{O,N}|$ of zero or the nyquist frequency. After determining that $\hat{f}_{a2}$ is actually within $|e_{O,N}|$ of the nyquist frequency, the frequency measurement method and apparatus will proceed to measure the frequency of the signal as 4,318.65; accurate to 1.35 MHz.

As the foregoing examples illustrate, the frequency measurement method and associated apparatus of the present invention determines the frequency of a periodic signal, even though the frequency of the periodic signal exceeds the nyquist frequency of the A/D converter sampling rate. The current method and apparatus accounts for errors due to sampling, conversions, and calculations in determining the frequency of the periodic signal. By determining the frequency with greater accuracy, conversion time is reduced because less accurate conversion algorithms are required.

In the drawings and the specification, there has been set forth preferred embodiments of the invention, and, although specific terms are employed, the terms are used in a generic and descriptive sense only and not for the purpose of limitation, the scope of the invention being set forth in the following claims.

That which is claimed is:

1. A method for estimating the frequency of a periodic signal, wherein said method comprises the steps of:
   sampling said periodic signal, wherein said sampling step comprises sampling at a plurality of sampling rates to obtain a plurality of time-domain sample sets of said periodic signal;
   converting each of said plurality of time-domain sample sets into respective frequency-domain sample sets;
   determining, for each of said plurality of frequency-domain sample sets, an alias frequency associated with the respective frequency-domain sample set;
   selecting a subset of said plurality of alias frequencies; and determining said frequency of said periodic signal based upon said selected subset of alias frequencies, wherein said selecting step further comprises the step of selecting the subset of said plurality of alias frequencies so as to reduce errors in the subsequent determination of the frequency of said periodic signal such that the frequency of the periodic signal can be determined even though the frequency of the periodic signal exceeds the largest nyquist frequency established by said plurality of sampling rates.

2. A method according to claim 1 wherein said sampling step further comprises the step of selecting said plurality of sampling rates for determining the frequency of the periodic signal based at least partially on sampling errors, frequency calculation errors, desired frequency ranges, and measurement precision.

3. A method according to claim 1 wherein said sampling step further comprises the step of determining the maximum estimatable frequency, wherein said determining step determines said maximum estimatable frequency at least partially based on said largest nyquist frequency established by said plurality of sampling rates, sampling errors, frequency calculation errors, desired frequency ranges, and measurement precision.

4. A method according to claim 3 wherein said sampling step further comprises the step of determining a frequency sample separation increment between each of said plurality of sampling rates, and wherein said determining step determines said frequency sample separation increment based on said maximum estimatable frequency, a maximum sample rate of said plurality of sample rates, and a minimum desired estimatable frequency.

5. A method according to claim 1 wherein said sampling step further comprises the step of determining a frequency estimation error, wherein said determining step determines said frequency estimation error at least partially based upon input signal noise errors, sampling errors, and calculation errors.

6. A method according to claim 5 wherein said selecting step for selecting said subset of said plurality of alias frequencies comprises the step of selecting alias frequencies which are not within said frequency estimation error of either zero or a respective nyquist frequency established by said plurality of sampling rates.

7. A method according to claim 1 wherein said converting step comprises the step of selecting one of a plurality of conversion routines, and wherein said selecting step comprises the steps of:

selecting desired low and high frequency limits, and a desired frequency estimation error limit;

determining a maximum estimatable frequency and an achievable frequency estimation error;

comparing said desired high frequency limit and said desired frequency estimation error limit to said maximum estimatable frequency and said achievable frequency estimation error, respectively; and determining the conversion routine for converting each of said plurality of time-domain sample sets into respective frequency-domain sample sets based on the results of said comparing step.

8. A method according to claim 1 wherein said sampling step comprises sampling at a first, second, and third sampling rate to obtain a first, second, and third time-domain sample set of said periodic signal; wherein said converting step comprises converting said first, second, and third time-domain sample sets into respective first, second, and third frequency-domain sample sets; wherein said determining step comprises determining, for each of the first, second, and third frequency-domain sample sets, a respective first, second, and third alias frequency; and wherein said selecting step comprises selecting a subset of said alias frequencies from said first, second, and third alias frequencies.

9. A method according to claim 8 wherein said selecting step comprises selecting said second and third alias frequencies if said first alias frequency is within a predetermined frequency estimation error of either zero or the nyquist frequency established by said first sample rate.

10. A method according to claim 8 wherein said selecting step comprises selecting said first and third alias frequencies if said second alias frequency is within a predetermined frequency estimation error of either zero or the nyquist frequency established by said second sample rate.

11. A method according to claim 8 wherein said selecting step comprises selecting said first and second alias frequencies if said third alias frequency is within a predetermined frequency estimation error of either zero or the nyquist frequency established by said third sample rate.

12. A method according to claim 1 wherein said sampling step comprises the step of sampling said plurality of time-domain sample sets sequentially.

13. A method according to claim 1 wherein said sampling step comprises the step of sampling said plurality of time-domain sample sets simultaneously.

14. A method for selecting a subset of alias frequencies from a plurality of alias frequencies generated during sampling of a periodic signal at a plurality of sampling rates in order to determine the frequency of the periodic signal, wherein said method comprises the steps of:

determining a frequency estimation error at least partially based upon input signal noise errors, sampling errors, and calculation errors; and selecting a subset of alias frequencies which are not within said frequency estimation error of either zero or a respective nyquist frequency in order to determine the frequency of the periodic signal.

15. A method according to claim 14 wherein first, second, and third alias frequencies occur during sampling of the periodic signal at first, second, and third sampling rates, and wherein said selecting step comprises the step of selecting two of said first, second, and third alias frequencies.

16. A method according to claim 1S wherein said selecting step comprises selecting said second and third alias frequencies if said first alias frequency is within a predetermined frequency estimation error of either zero or the nyquist frequency established by said first sample rate.

17. A method according to claim 15 wherein said selecting step comprises selecting said first and third alias frequencies if said second alias frequency is within a predetermined frequency estimation error of either zero or the nyquist frequency established by said second sample rate.

18. A method according to claim 15 wherein said selecting step comprises selecting said first and second alias frequencies if said third alias frequency is within a predetermined frequency estimation error of either zero or the nyquist frequency established by said third sample rate.

19. A method for selecting a plurality of sampling rates $f_i$ for determining the frequency of a periodic signal, wherein said method comprises the steps of:

selecting a first sampling rate $f_{smax}$, wherein said first sampling rate $f_{smax}$ is the largest of said plurality of sampling rates $f_i$;

determining the maximum estimatable frequency of said periodic signal;

determining a frequency sample separation increment Δf,
wherein said frequency sample separation increment Δf is based on the value of said maximum estimatable frequency, said first sampling rate $f_{smax}$, and the minimum desired estimatable frequency; and determining a plurality of sampling rates fi,
wherein the sampling rates are determined as follows:

$$f_i = f_{smax} - (i * \Delta f)$$

where $f_{smax}$=first sampling rate, and
i=(1, 2, 3, . . . ).

20. A frequency measurement apparatus for estimating the frequency of a periodic signal, wherein said apparatus comprises:

an analog to digital converter for sampling the periodic signal at a plurality of sampling rates to obtain a plurality of time-domain sample sets of said periodic signal;

a digital signal processor positioned to receive said plurality of time-domain sample sets from said analog to digital converter, wherein said digital signal processor comprises a converter for converting said plurality of time-domain sample sets to a respective plurality of frequency-domain sample sets;

first determining means for receiving said plurality of frequency-domain sample sets from said digital signal processor, wherein said first determining means determines, for each of said plurality of frequency-domain sample sets, an alias frequency associated with the respective frequency-domain sample set;

selecting means for selecting a subset of said plurality of alias frequencies; and second determining means for receiving said subset of alias frequencies, wherein said second determining means determines said frequency of said periodic signal based upon said selected subset of alias frequencies;

wherein said selecting means further comprises means for selecting the subset of said plurality of alias frequencies so as to reduce errors in the subsequent determination of the frequency of said periodic signal such that the frequency of the periodic signal can be determined even though the frequency of the periodic signal exceeds the largest nyquist frequency established by said plurality of sampling rates.

21. An apparatus according to claim 20 wherein said analog to digital converter comprises clock means for triggering said analog to digital converter to sequentially obtain the plurality time-domain sample sets of said periodic signal.

22. An apparatus according to claim 20 wherein said analog to digital converter comprises a plurality of analog to digital convertors for sampling at a plurality of sampling rates simultaneously in order to obtain a plurality of time-domain sample sets of said periodic signal, wherein each analog to digital converter samples at one sample rate of said plurality of sampling rates such that each analog to digital converter is sampling at a different sampling rate.

23. An apparatus according to claim 20 further comprises:

a plurality of sample and hold circuits, upstream of said analog to digital converter, for simultaneously capturing a sample of said periodic signal;

multiplexing means positioned to receive said plurality of samples from said sample and hold circuits and provide said samples, one at a time to said analog to digital converter; and demultiplexing means positioned to receive said time-domain sample sets from said analog to digital converter such that said digital signal processor can convert said plurality of time-domain sample sets to a respective plurality of frequency-domain sample sets.

* * * * *

UNITED STATES PATENT AND TRADEMARK OFFICE
CERTIFICATE OF CORRECTION

PATENT NO.    : 6,026,418
DATED         : February 15, 2000
INVENTOR(S)   : Duncan, Jr.

It is certified that error appears in the above-identified patent and that said Letters Patent is hereby corrected as shown below:

Column 8,
Line 19, "-$f_s$" should read -- -$f_a$ --.

Column 11,
Line 36, "$f_{s2}=$" should read -- $f_{a2}=$ --.

Column 12,
Line 1, "$nf_{s1} + \frac{f_{s2}}{2}$" should read -- $n\frac{f_{s1}+f_{s2}}{2}$ --.

Line 13, "$\underset{=}{<}$" should read -- $\leq$ --.

Line 25, "$\hat{n}f_{s1} + \frac{f_{s2}}{2}$" should read -- $\hat{n}\frac{f_{s1}+f_{s2}}{2}$ --.

Line 29, "$\underset{=}{<}$" should read -- $\leq$ --.

Line 53, "$nf_{s3} + \frac{f_{s2}}{2}$" should read -- $n\frac{f_{s3}+f_{s2}}{2}$ --.

Line 56, "$\underset{=}{<}$" should read -- $\leq$ --.

Column 13,
Line 1, "$\hat{n}f_{s3} + \frac{f_{s2}}{2}$" should read -- $\hat{n}\frac{f_{s3}+f_{s2}}{2}$ --.

Line 4, "$\underset{=}{<}$" should read -- $\leq$ --.

Line 28, "$nf_{s3} \cdot -\frac{f_{s3}}{2}$" should read -- $nf_{s3} - \frac{f_{s3}}{2}$ --.

Column 14,
Line 15, "$\hat{n}f_{s1} + \frac{f_{s2}}{2}$" should read -- $\hat{n}\frac{f_{s1}+f_{s2}}{2}$ --.

Line 17, "$\hat{n}f_{s3} + \frac{f_{s2}}{2}$" should read -- $\hat{n}\frac{f_{s3}+f_{s2}}{2}$ --.

Line 53, "$|f_{a2} - f_{1a}| - f_{a2}| < \Delta f$" should read -- $|f_{a2} - f_{a1}| - |f_{a3} - f_{a2}| < \Delta f$ --.

UNITED STATES PATENT AND TRADEMARK OFFICE
CERTIFICATE OF CORRECTION

PATENT NO. : 6,026,418
DATED : February 15, 2000
INVENTOR(S) : Duncan, Jr.

It is certified that error appears in the above-identified patent and that said Letters Patent is hereby corrected as shown below:

Column 14 (continued),
Line 59, "$\hat{n} f_{s3} + \frac{f_{s2}}{2}$" should read -- $\hat{n} \frac{f_{s3} + f_{s2}}{2}$ --.

Line 63, "$f_{a3} f_{a2} < 0$" should read -- $f_{a3} f_{a2} \leq 0$ --.

Column 15,
Line 9, "$<$" should read -- $\leq$ --.

Line 62, "$e_s$" should read -- $e_B$ --.
Line 65, "e." should read -- e, --.

Column 16,
Line 4, "$|e_{0,n}$" should read -- $|e_{0,N}$ -- .

Column 17,
Line 9, "$<$" should read -- $\leq$ --.

Line 30, "$|f_{a2} - f_{a2}|$" should read -- $|f_{a2} - f_{a1}|$ --.

Column 18,
Line 23, insert -- (25) -- after the equation.
Line 25, insert -- (26) -- after the equation.
Line 36, delete "(28)" and insert -- (27) --.
Line 38, insert -- (28) -- after the equation
Line 57, "$<$" should read -- $\leq$ --.

Column 19,
Line 41, "$<$" should read -- $\leq$ --.
Line 46, "$<$" should read -- $\leq$ --.

Column 20,
Line 19, "$\hat{n} f_{s1} + \frac{f_{s3}}{2}$" should read -- $\hat{n} \frac{f_{s1} + f_{s3}}{2}$ --.
Line 54, "$\hat{n} f_{s1} + \frac{f_{s3}}{2}$" should read -- $\hat{n} \frac{f_{s1} + f_{s3}}{2}$ --.

UNITED STATES PATENT AND TRADEMARK OFFICE
CERTIFICATE OF CORRECTION

PATENT NO. : 6,026,418
DATED : February 15, 2000
INVENTOR(S) : Duncan, Jr.

It is certified that error appears in the above-identified patent and that said Letters Patent is hereby corrected as shown below:

Column 22,
Lines 35-36, " $f_{s2}f_{s3} - \Delta f$ " should read -- $f_{s2} = f_{s3} - \Delta f$ --.

Column 24,
Line 53, "$\leq \Delta f \leq$" should read -- $\leq \Delta f \leq$ --.

Column 25,
Line 19, "9,999.4" should read -- 19,999.4 --.
Line 44, "1100" should read -- 1,000 --.
Line 67, "$\leq \Delta f \leq$" should read -- $\leq \Delta f \leq$ --.

Column 28,
Line 45, "claim 1S" should read -- claim 15 --.

Column 29,
Line 6, "fi" should read -- $f_i$ --.

Column 30,
Line 17, "convertors" should read -- converters --.

Signed and Sealed this

Twelfth Day of February, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.    : 6,026,418
DATED         : February 15, 2000
INVENTOR(S)   : Duncan, Jr.

It is certified that error appears in the above-identified patent and that said Letters Patent is hereby corrected as shown below:

<u>Column 14,</u>
Line 63, " $f_{a3} \, f_{a2} < 0$ " should read -- $f_{a3}-f_{a2} \leq 0$ --.

<u>Column 15,</u>
Line 65, "c," should read -- e, --.

<u>Column 18,</u>
Line 57, "$\geqq$" should read -- $\geq$ --.

<u>Column 19,</u>
Line 41, "$\geqq$" should read -- $\geq$ --.
Line 46, "$\geqq$" should read -- $\leq$ --.

This certificate supersedes Certificate of Correction issued February 12, 2002.

Signed and Sealed this

Tenth Day of December, 2002

JAMES E. ROGAN
*Director of the United States Patent and Trademark Office*